US009043539B2

(12) United States Patent
Kaiwa et al.

(10) Patent No.: US 9,043,539 B2
(45) Date of Patent: May 26, 2015

(54) SEMICONDUCTOR DEVICE HAVING A MEMORY AND CALIBRATION CIRCUIT THAT SELECTIVELY ADJUSTS AN IMPEDANCE OF AN OUTPUT BUFFER DEPENDENT UPON REFRESH COMMANDS

(75) Inventors: Nakaba Kaiwa, Tokyo (JP); Yutaka Ikeda, Tokyo (JP); Hiroki Fujisawa, Tokyo (JP); Tetsuaki Okahiro, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 775 days.

(21) Appl. No.: 12/923,261

(22) Filed: Sep. 10, 2010

(65) Prior Publication Data

US 2011/0066798 A1 Mar. 17, 2011

(30) Foreign Application Priority Data

Sep. 11, 2009 (JP) ................................ 2009-210031
Jul. 14, 2010 (JP) ................................ 2010-159452

(51) Int. Cl.
| | |
|---|---|
| *G06F 12/00* | (2006.01) |
| *G11C 7/00* | (2006.01) |
| *G11C 11/406* | (2006.01) |
| *G11C 7/04* | (2006.01) |
| *G11C 7/10* | (2006.01) |
| *G11C 7/20* | (2006.01) |

(Continued)

(52) U.S. Cl.
CPC ................ *G11C 11/406* (2013.01); *G11C 7/04* (2013.01); *G11C 7/1057* (2013.01); *G11C 7/20* (2013.01); *G11C 11/40611* (2013.01); *G11C 11/40626* (2013.01); *G11C 11/4072* (2013.01); *G11C 11/4093* (2013.01); *G11C 2207/2254* (2013.01); *G11C 2211/4061* (2013.01)

(58) Field of Classification Search
CPC .................. G11C 11/40626; G11C 11/40611; G11C 11/4093; G11C 7/1057; G11C 2211/4061; G11C 2207/2254
USPC ........................................... 711/106; 365/222
See application file for complete search history.

(56) References Cited

U.S. PATENT DOCUMENTS

| 6,714,465 B2 | 3/2004 | Jang ............................ 365/194 |
| 7,839,159 B2 | 11/2010 | Nakamura et al. ............ 324/765 |

(Continued)

FOREIGN PATENT DOCUMENTS

| JP | 2003-151274 A | 5/2003 |
| JP | 2007-123987 A | 5/2007 |

(Continued)

*Primary Examiner* — Sanjiv Shah
*Assistant Examiner* — Glenn Gossage
(74) *Attorney, Agent, or Firm* — Kunzler Law Group, PC

(57) ABSTRACT

A semiconductor device having a circuit that selectively adjusts an impedance of an output buffer. A calibration operation can be performed automatically without issuing a calibration command from a controller. Because a calibration operation to a memory is performed in response to an auto refresh command having been issued for a predetermined number of times, a periodic calibration operation can be secured, and a read operation or a write operation is not requested from a controller during a calibration operation. A start-up circuit activates the calibration circuit when a refresh counter indicates a predetermined value, and prohibits a refresh operation in response to the auto refresh command when the calibration circuit is activated. A temperature detecting circuit may be used to change the frequency of performing a calibration operation.

18 Claims, 21 Drawing Sheets

(51) Int. Cl.
*G11C 11/4072* (2006.01)
*G11C 11/4093* (2006.01)

(56) References Cited

U.S. PATENT DOCUMENTS

| | | | |
|---|---|---|---|
| 8,045,411 B2 | 10/2011 | Kim et al. | 365/211 |
| 8,355,288 B2 | 1/2013 | Kim et al. | 365/211 |
| 2006/0158198 A1* | 7/2006 | Fujisawa | 324/601 |
| 2007/0148796 A1* | 6/2007 | Nakamura et al. | 438/17 |
| 2008/0046212 A1 | 2/2008 | Yoko et al. | 702/107 |
| 2008/0122450 A1* | 5/2008 | Yokou | 324/601 |
| 2008/0140923 A1* | 6/2008 | Bellows et al. | 711/106 |
| 2008/0252332 A1* | 10/2008 | Lee et al. | 326/30 |
| 2009/0009213 A1* | 1/2009 | Osanai et al. | 326/30 |
| 2009/0121742 A1* | 5/2009 | Park | 326/30 |
| 2010/0156455 A1* | 6/2010 | Yang et al. | 326/30 |
| 2011/0055671 A1* | 3/2011 | Kim et al. | 714/800 |
| 2011/0283060 A1* | 11/2011 | Ware et al. | 711/106 |

FOREIGN PATENT DOCUMENTS

| | | |
|---|---|---|
| JP | 2007-287315 A | 11/2007 |
| JP | 2008-048361 | 2/2008 |

* cited by examiner

SEMICONDUCTOR DEVICE HAVING A MEMORY AND CALIBRATION CIRCUIT THAT SELECTIVELY ADJUSTS AN IMPEDANCE OF AN OUTPUT BUFFER DEPENDENT UPON REFRESH COMMANDS

BACKGROUND OF THE INVENTION

1. Field of the Invention

The present invention relates to a semiconductor device and a data processing system including the same, and more particularly relates to a semiconductor device including a calibration circuit that adjusts an impedance of an output buffer and to a data processing system including the semiconductor device.

2. Description of Related Art

A semiconductor device such as a DRAM (Dynamic Random Access Memory) sometimes includes a calibration circuit that adjusts an impedance of an output buffer (see Japanese Patent Application Laid-open No. 2008-048361, or its patent family member, U.S. Patent Publication 2008/0046212). The calibration circuit is activated by a calibration command issued from a controller.

The calibration command includes a long calibration command (ZQCL) and a short calibration command (ZQCS). The long calibration command (ZQCL) is issued at a time of returning from an initialization period after power activation or from a self-refresh mode, and its calibration period is set relatively long. On the other hand, the short calibration command (ZQCS) is periodically issued during a normal operation, and its calibration period is set relatively short.

As described above, because the short calibration command (ZQCS) is periodically issued from a controller, a timer circuit or the like has to be provided at a controller side, and a control at the controller side becomes complex.

Further, because a read command cannot be issued during a calibration operation, utilization efficiency of a command bus is degraded. In addition, while a resistance value of an external resistor connected to a semiconductor device is referred during a calibration operation, when one external resistor is shared by plural semiconductor devices to reduce the number of elements, calibration operation periods of these semiconductor devices need to be shifted from each other, and thus a control becomes complex.

Therefore, a semiconductor device that automatically performs a calibration has been desired instead of semiconductor devices that issue the short calibration command (ZQCS) from a controller side. However, a calibration operation needs to be periodically performed, and a read operation and a write operation cannot be performed during the calibration operation. Accordingly, when automatically performing a calibration operation at a semiconductor device side, designing needs to take these factors into consideration.

SUMMARY

In one embodiment, there is provided a semiconductor device comprising: an output buffer; a calibration circuit that adjusts an impedance of the output buffer; and a start-up circuit that activates the calibration circuit when an auto refresh command has been issued for a predetermined number of times.

In another embodiment, there is provided a data processing system comprising: the semiconductor device described above; and a controller that issues the auto refresh command to the semiconductor device.

According to the present invention, a calibration can be performed automatically at a semiconductor device side without issuing a calibration command from a controller side. Furthermore, because a calibration operation is performed when an auto refresh command has been issued a predetermined number of times, a periodic calibration operation can be secured, and a read operation or a write operation is not requested from the controller during a calibration operation.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
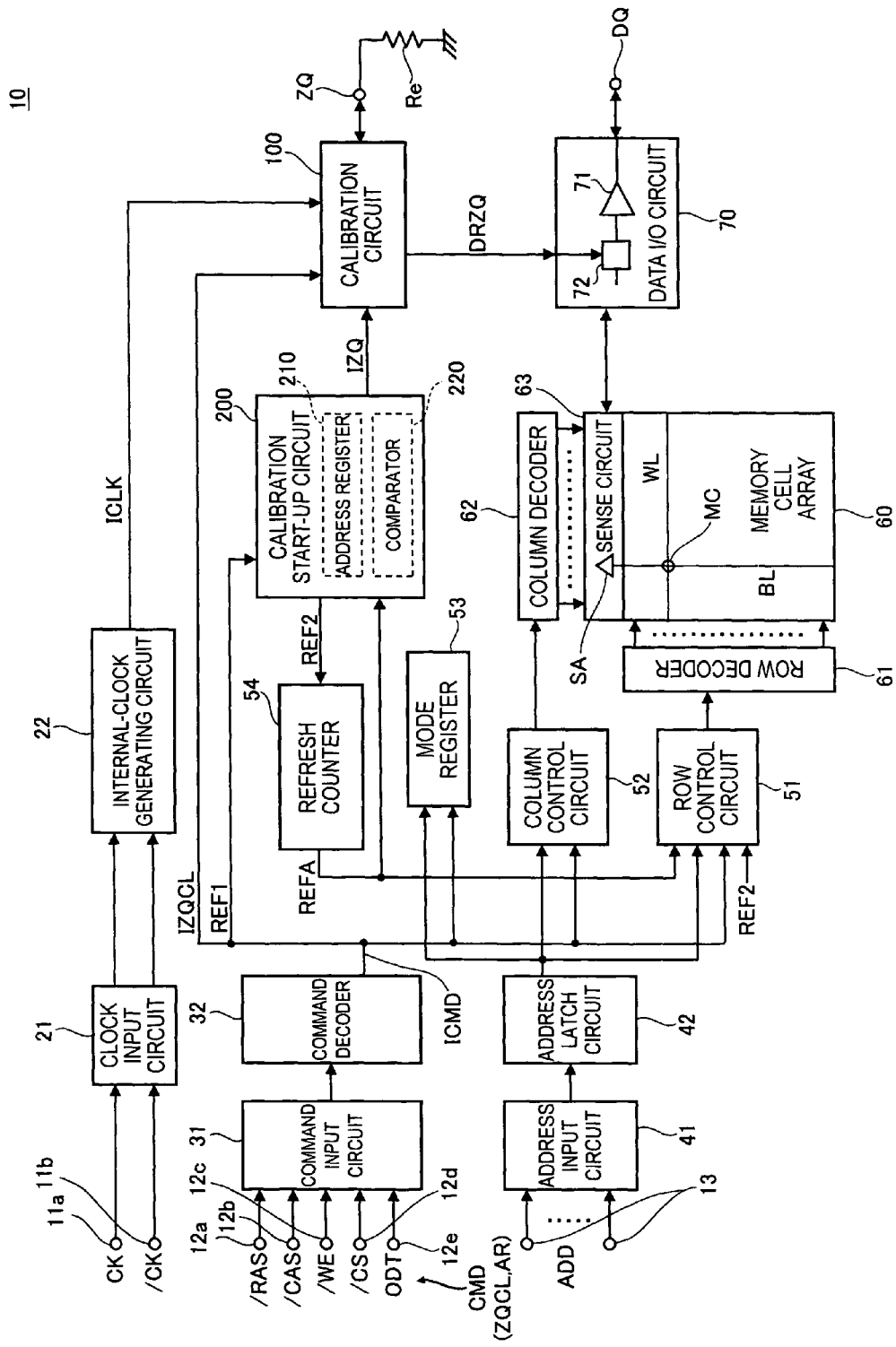
FIG. 1 is a block diagram showing an overall configuration of a semiconductor device according to a first embodiment of the present invention.

FIG. 1 is a block diagram showing an overall configuration of a semiconductor device 10 according to a first embodiment of the present invention.

The semiconductor device 10 according to the first embodiment is a DDR SDRAM (double data rate synchronous dynamic random access memory), and includes clock terminals 11a and 11b, command terminals 12a to 12e, an address terminal 13, a data input/output terminal DQ, and a calibration terminal ZQ, as external terminals. Although the semiconductor device 10a also includes a power source terminal, a data strobe terminal or the like, these terminals are not shown in FIG. 1.

The clock terminals 11a and 11b are supplied with external clock signals CK and /CK, respectively, and supply the supplied external clock signals CK and /CK to a clock input circuit 21. In the present specification, a signal having "/" attached to the head of a signal name means an inverted signal of a corresponding signal or an active low signal. Therefore, the external clock signals CK and /CK are mutually complementary signals. An output of the clock input circuit 21 is supplied to an internal-clock generating circuit 22. The internal-clock generating circuit 22 generates an internal clock signal ICLK. The internal clock signal ICLK is supplied to various internal circuits that include a calibration circuit 100, and is used as a synchronization signal.

The command terminals 12a to 12e are supplied with a row-address strobe signal /RAS, a column-address strobe signal /CAS, a write enable signal /WE, a chip select signal /CS, and an on-die termination signal ODT, respectively. These command signals CMD are supplied to a command input circuit 31. These command signals CMD input to the command input circuit 31 are supplied to a command decoder 32. The command decoder 32 generates various internal commands ICMD by holding, decoding, and counting command signals.

As shown in FIG. 1, among the internal commands ICMD, an internal long-calibration command IZQCL is supplied to at least the calibration circuit 100, and an internal refresh command REF1 is supplied to at least a calibration start-up circuit 200. The internal long-calibration command IZQCL is an internal command activated when along calibration command ZQCL is issued via the command terminals 12a to 12e. The internal refresh command REF1 is an internal command activated when an auto refresh command AR is issued via the command terminals 12a to 12e. Other internal commands ICMD are supplied to a row control circuit 51, a column control circuit 52, and a mode register 53.

The long calibration command ZQCL is issued at a time of returning from an initialization period after power activation or from a self-refresh mode. For example, 512 tCK is allocated for a calibration period (tCK is one clock cycle of an external clock signal CK). In the first embodiment, a short calibration command (ZQCS) does not need to be issued from outside.

Meanwhile, the auto refresh command AR is issued from outside at a predetermined frequency. In principle, a count value of a refresh counter 54 is incremented each time when the auto refresh command AR is issued. The refresh counter 54 shows a row address (a refresh address REFA) to be refreshed. The auto refresh command AR is cyclically issued such that a count value makes one cycle within a predetermined period (64 ms according to the specification set for the first embodiment). For example, the auto refresh command AR is issued at a frequency of about 7.8 microseconds or 7.8 μs (=64 ms/8196) on average when there are 8K (=8196) row addresses.

The address terminals 13 are supplied with address signals ADD, and supply the supplied address signals ADD to an address input circuit 41. An output of the address input circuit 41 is supplied to an address latch circuit 42. Out of address signals ADD latched by the address latch circuit 42, a row address is supplied to the row control circuit 51, and a column address is supplied to the column control circuit 52. When a mode register set command is issued from outside, the address signals ADD are supplied to the mode register 53, thereby updating a content of the mode register 53.

An output of the row control circuit 51 is supplied to a row decoder 61. The row decoder 61 selects a word line WL included in a memory cell array 60. In the memory cell array 60, plural word lines WL and plural bit lines BL cross each other. Memory cells MC are arranged at intersections of these lines (only one word line WL, one bit line BL, and one memory cell MC are shown in FIG. 1). Bit lines BL are connected to corresponding sense amplifiers SA within a sense circuit 63.

An output of the column control circuit 52 is supplied to a column decoder 62. The column decoder 62 selects a sense amplifier SA included in the sense circuit 63. A sense amplifier SA selected by the column decoder 62 is connected to a data input/output circuit 70.

The data input/output circuit 70 is connected to the data input/output terminal DQ, and includes an output buffer 71 and an impedance adjusting circuit 72 as shown in FIG. 1. The output buffer 71 outputs read data via the data input/output terminal DQ, and the impedance adjusting circuit 72 adjusts an output impedance of the output buffer 71. Although not shown, the data input/output circuit 70 also includes input buffers. With this arrangement, in a read operation, data read from the memory cell array 60 via the sense circuit 63 and a data input/output circuit 70 is output from the data input/output terminal DQ in a predetermined impedance. On the other hand, in a write operation, write data input to the data input/output terminal DQ is written into the memory cell array 60 via the data input/output circuit 70 and the sense circuit 63.

Adjustment of an impedance by the impedance adjusting circuit 72 is designated by an impedance code DRZQ supplied from the calibration circuit 100. The calibration circuit 100 performs a calibration operation by referencing a resistance value of an external resistor Re connected to the calibration terminal ZQ, thereby generating the impedance code DRZQ. A calibration operation of the calibration circuit 100 is started in response to an internal calibration command IZQ or the internal long-calibration command IZQCL supplied from the calibration start-up circuit 200. The calibration circuit 100 is described in detail later.

The calibration start-up circuit 200 generates the internal calibration command IZQ, and includes an address register 210 and a comparator 220 as shown in FIG. 1. The internal calibration command IZQ is used to perform a short calibration. The calibration start-up circuit 200 also generates an internal refresh command REF2. The calibration start-up circuit 200 is also described in detail later.

The internal refresh command REF2 is supplied to the refresh counter 54 and the row control circuit 51. A count value of the refresh counter 54 is incremented in response to the internal refresh command REF2. This count value shows a row address (the refresh address REFA) to be refreshed. The refresh address REFA is supplied to the row control circuit 51 together with the internal refresh command REF2. The row control circuit 51 activates a word line shown by the refresh address REFA when the internal refresh command REF2 is activated. Accordingly, all memory cells MC connected to this word line are refreshed.

The overall configuration of the semiconductor device 10 according to the first embodiment is as described above.

Figure 2:
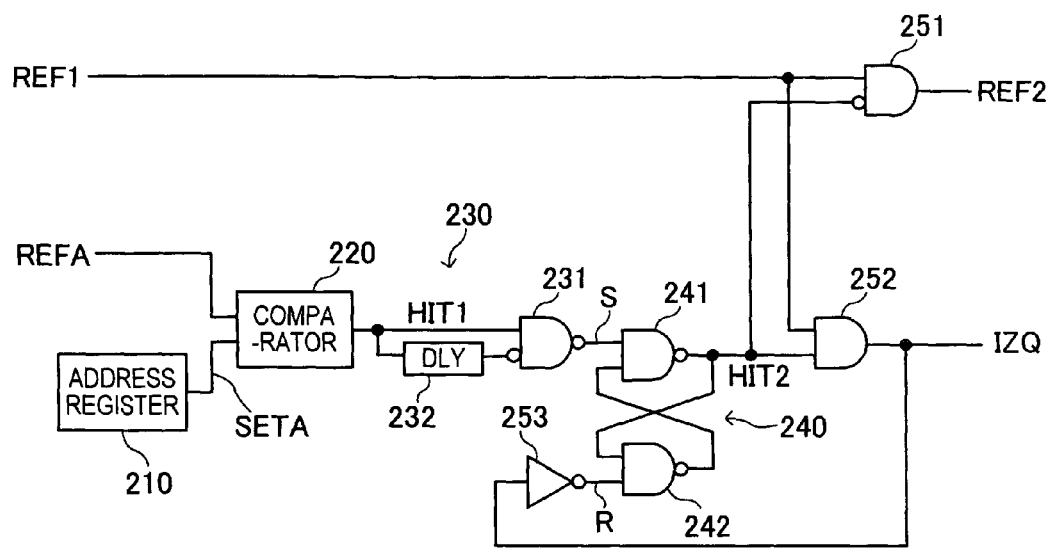
FIG. 2 is a circuit diagram of a calibration start-up circuit.

FIG. 2 is a circuit diagram of the calibration start-up circuit 200.

As shown in FIG. 2, the calibration start-up circuit 200 includes an address register 210 that stores a row address, and a comparator 220 that compares a row address SETA held in the address register 210 with the refresh address REFA. The address register 210 stores an arbitrary row address SETA, and the number of bits of this address matches that of bits of the refresh address REFA in the first embodiment. A value of the row address SETA is not particularly limited. A circuit configuration of the address register 210 is not particularly limited, and a fuse circuit and a latch circuit can be used for this circuit. The comparator 220 compares these addresses and activates a hit signal HIT1 at a high level when both addresses match.

A hit signal HIT is supplied to a one-shot pulse generating circuit 230 that is constituted by a NAND gate 231 and a delay circuit 232. Accordingly, when the hit signal HIT1 changes to a high level, a set pulse SET as an output of the one-shot pulse generating circuit 230 is temporarily activated at a low level. The set pulse SET is supplied to a set input S of an SR (set-reset) latch circuit 240.

The SR latch circuit 240 has a configuration having NAND gates 241 and 242 connected in cascade. An input at a NAND gate 241 is the set input S, and an input at a NAND gate 242 is a reset input R. A hit signal HIT2 as an output of the SR latch circuit 240 is supplied to one input (an inverted input) of an AND gate 251, and is also input to one input of an AND gate 252.

The internal refresh command REF1 is supplied to the other input of the AND gates 251 and 252, respectively. Accordingly, the internal refresh command REF2 as an output of the AND gate 251 is activated linked to the internal refresh command REF1 in case the SR latch circuit 240 is reset. On the other hand, in case the SR latch circuit 240 is set, the internal refresh command REF2 is not activated even when the internal refresh command REF1 is activated. On the other hand, the internal calibration command IZQ as an output of the AND gate 252 is activated linked to the internal refresh command REF1 in case the SR latch circuit 240 is set. On the other hand, in case the SR latch circuit 240 is reset, the internal calibration command IZQ is not activated even when the internal refresh command REF1 is activated.

The internal calibration command IZQ is input to the reset input R of the SR latch circuit 240 via an inverter 253. Accordingly, the SR latch circuit 240 returns to a reset state when the internal calibration command IZQ is activated.

With the above configuration, the calibration start-up circuit 200 outputs the internal refresh command REF1 directly as the internal refresh command REF2 when the refresh address REFA does not match the row address SETA. In this case, the internal calibration command IZQ is not activated. On the other hand, the internal calibration command IZQ is activated in response to the internal refresh command REF1 when the refresh address REFA matches the row address SETA. In this case, the internal refresh command REF2 is not activated. That is, the internal refresh command REF1 is converted to the internal calibration command IZQ each time when the refresh counter 54 makes one cycle.

The internal refresh command REF2 generated by the calibration start-up circuit 200 is supplied to the refresh counter 54 shown in FIG. 1 in this way. Consequently, a count value of the refresh counter 54 is incremented each time the auto refresh command AR is issued except when the refresh address REFA matches the row address SETA. On the other hand, even when the auto refresh command AR is issued, an increment of a count value of the refresh counter 54 is suspended when the refresh address REFA matches the row address SETA.

The internal calibration command IZQ generated by the calibration start-up circuit 200 is supplied to the calibration circuit 100 shown in FIG. 1. The calibration circuit 100 adjusts an output impedance of the output buffer 71 by updating the impedance code DRZQ supplied to the impedance adjusting circuit 72. The impedance code DRZQ is updated by a calibration operation in response to activation of the internal calibration command IZQ or the internal long-calibration command IZQCL.

Figure 3:
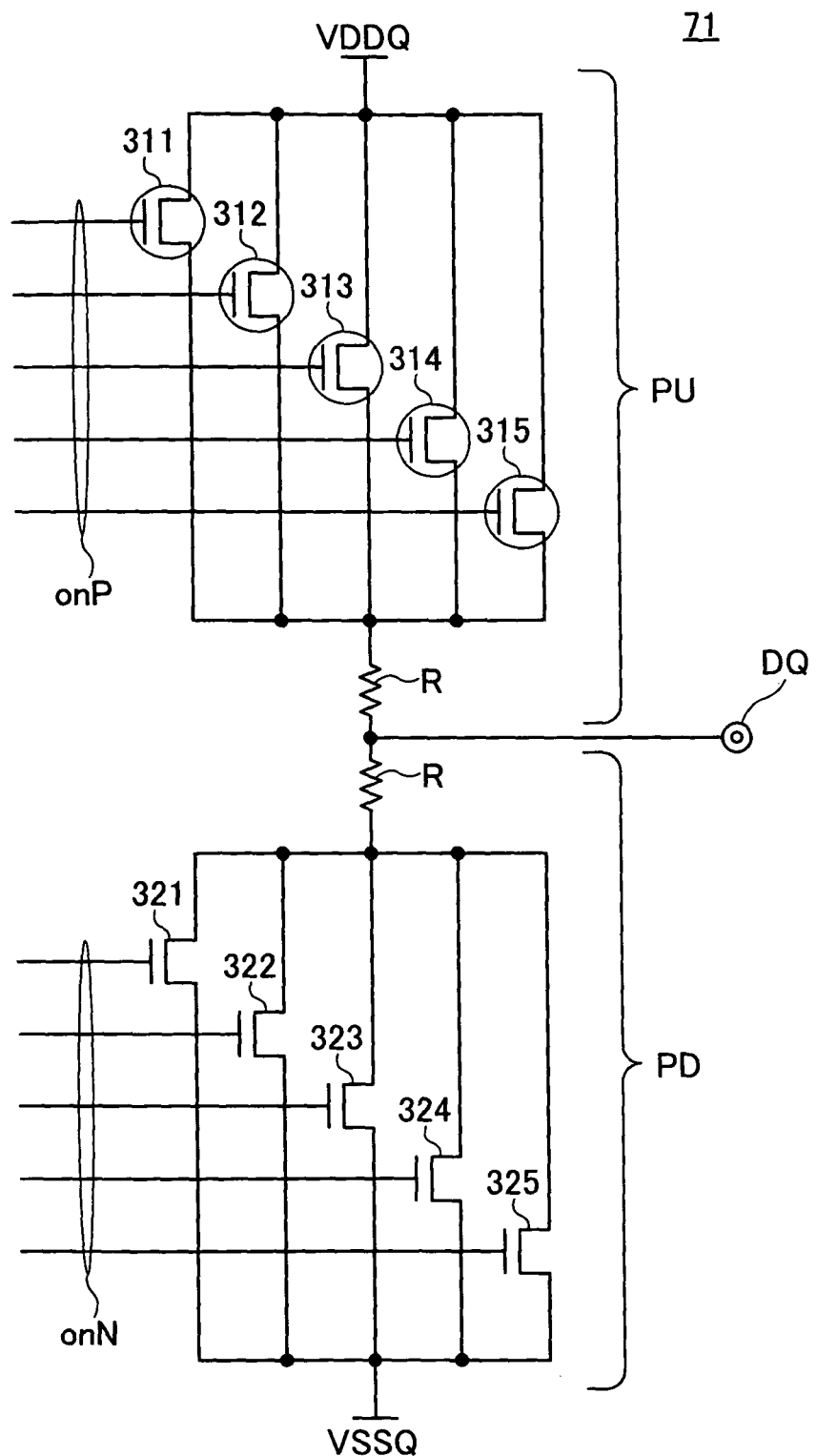
FIG. 3 is a circuit diagram of an output buffer.

FIG. 3 is a circuit diagram of the output buffer 71.

As shown in FIG. 3, the output buffer 71 includes plural (five in this embodiment) P-channel MOS transistors (output transistors) 311 to 315 connected in parallel between a power source terminal VDDQ and the data input/output terminal DQ, plural (five in this embodiment) N-channel metal oxide semiconductor (MOS) transistors (output transistors) 321 to 325 connected in parallel between a power source terminal VSSQ and the data input/output terminal DQ, and two resistors R connected in series between the output transistors 311 to 315 and the output transistors 321 to 325. A contact point of the two resistors R is connected to the data input/output terminal DQ. In the output buffer 71, a part including the P-channel MOS transistors 311 to 315 and the resistor R constitute a pull-up circuit PU, and a part including the N-channel MOS transistors 321 to 325 and the resistor R constitutes a pull-down circuit PD.

Corresponding bits of an ON signal on P are supplied to gates of the output transistors 311 to 315, respectively. Corresponding bits of an ON signal on N are supplied to gates of the output transistors 321 to 325, respectively. Accordingly, ten output transistors included in the output buffer 71 are individually ON/OFF controlled.

The pull-up circuit PU and the pull-down circuit PD are designed to have a predetermined impedance (120 ohms or 120Ω, for example) in a conduction state. However, because an ON resistance of an output transistor varies depending on a manufacturing condition and changes depending on an environmental temperature and a power source voltage at an operation time, a desired impedance is not necessarily obtained. Therefore, to set an actual impedance at a designed value, the number of output transistors to be turned ON needs to be adjusted. For this purpose, a parallel circuit that is constituted by plural output transistors is used.

To adjust an impedance of the output buffer 71 finely and in a broad range, preferably, W/L ratios (a gate width/a gate length ratio) of plural output transistors constituting the pull-up circuit PU and the pull-down circuit PD are mutually differentiated. Most preferably, a weight of a power of two is attached to the W/L ratios. That is, when a W/L ratio of the output transistor 311 is "1WLp", it is particularly preferable to set W/L ratios of the output transistors 312 to 315 at "2WLp", "4WLp", "8WLp", and "16WLp", respectively. Similarly, when a W/L ratio of the output transistor 321 is "1WLn", it is particularly preferable to set W/L ratios of the output transistors 322 to 325 at "2WLn", "4WLn", "8WLn", and "16WLn", respectively.

A resistance value of the resistor R is designed at the same value as an ON resistance of the parallel transistors, such as 120Ω. Accordingly, when at least one of the pull-up circuit PU and the pull-down circuit PD is in an ON state, an impedance of the output buffer 71 from a viewpoint of the data input/output terminal DQ becomes 240Ω (=120Ω+120Ω). A diffusion layer and a high resistance wiring using tungsten (W), titanium nitride (TiN) or the like can be used for the resistor R.

Figure 4:
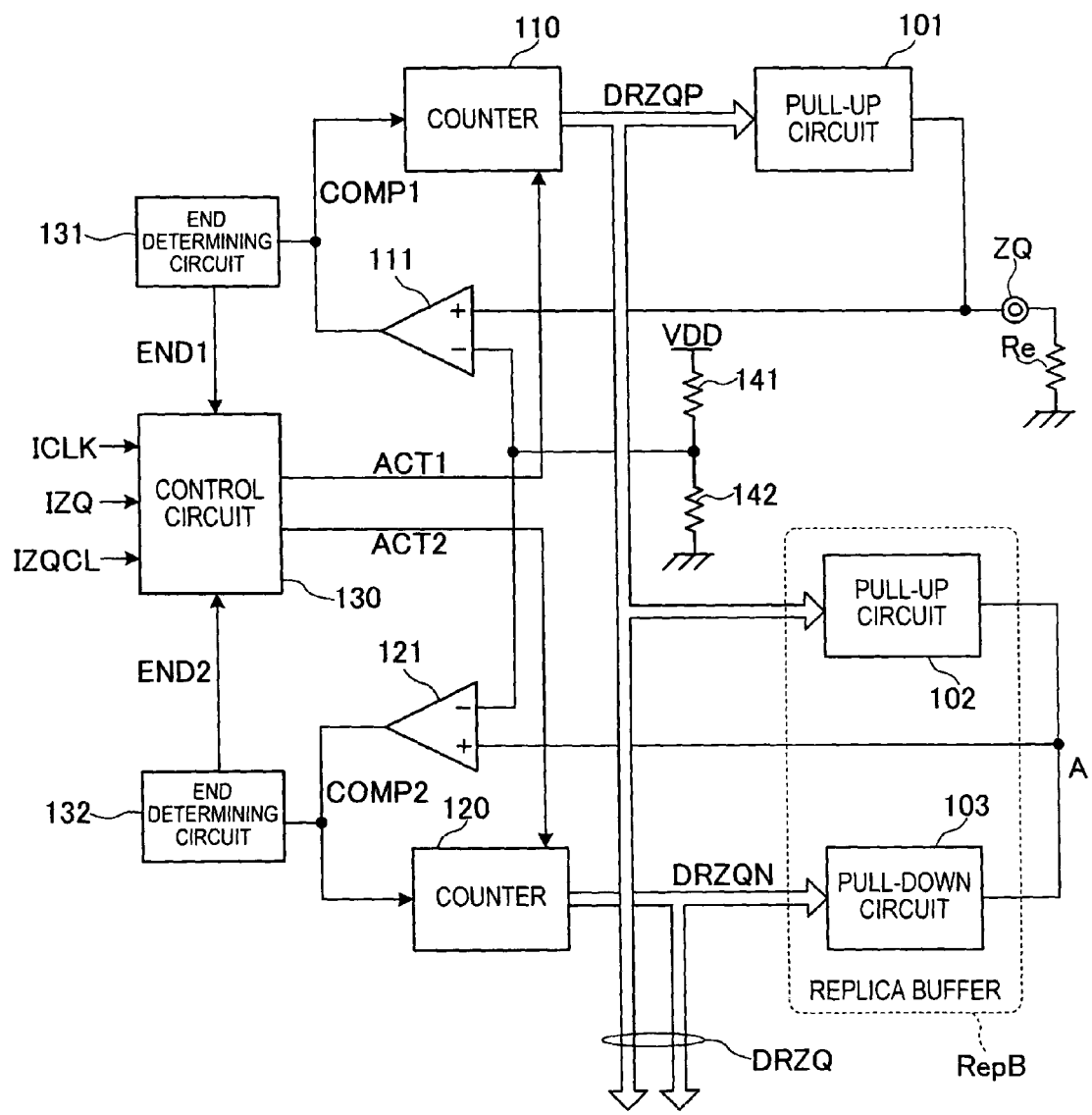
FIG. 4 is a circuit diagram of a calibration circuit.

FIG. 4 is a circuit diagram of the calibration circuit 100.

As shown in FIG. 4, the calibration circuit 100 includes pull-up circuits 101 and 102, a pull-down circuit 103, a counter 110 that designates an impedance of the pull-up circuits 101 and 102, a counter 120 that designates an impedance of the pull-down circuit 103, and a control circuit 130 that controls operations of the counters 110 and 120.

Figure 5:
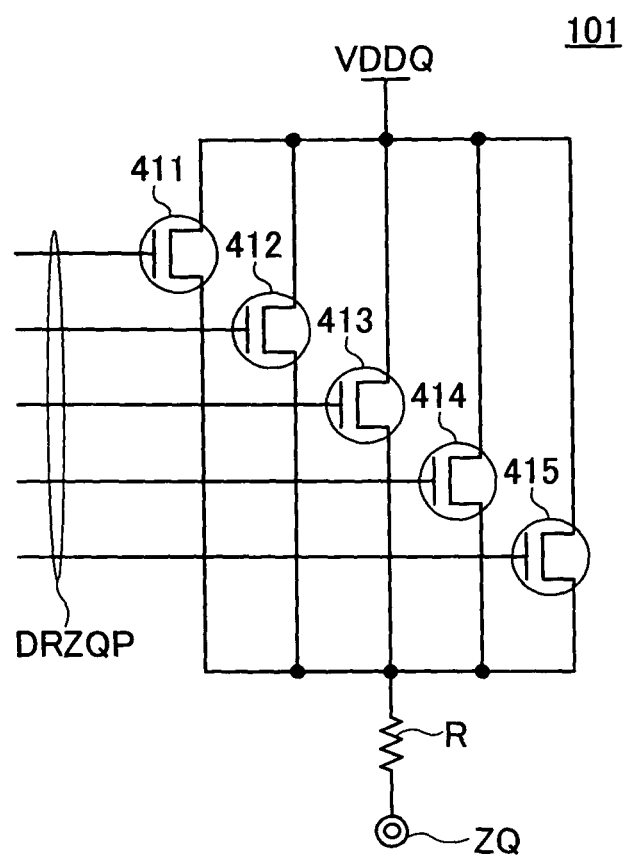
FIG. 5 is a circuit diagram of a pull-up circuit.

FIG. 5 is a circuit diagram of the pull-up circuit 101.

As shown in FIG. 5, the pull-up circuit 101 has substantially the same circuit configuration as that of the pull-up circuit PU included in the output buffer 71. That is, the pull-up circuit 101 includes five P-channel MOS transistors 411 to 415 connected in parallel between the power source terminal VDDQ, and the resistor R, one end of which is connected to drains of these transistors. The other end of the resistor R is connected to the calibration terminal ZQ.

The transistors 411 to 415 included in the pull-up circuit 101 correspond to the output transistors 311 to 315 shown in FIG. 3, and these transistors have the same impedance. Therefore, W/L ratios of the transistors 411 to 415 are set at "1WLp", "2WLp", "4WLp", "8WLp", and "16WLp", respectively like the W/L ratios of the transistors 311 to 315. However, so long as the impedances are substantially the same, the transistors 411 to 415 included in the pull-up circuit 101 and the output transistors 311 to 315 shown in FIG. 3 do not need to have exactly the same transistor size, and shrunk transistors can be used.

The resistor R also corresponds to the resistor R shown in FIG. 3. Therefore, a resistance value of the resistor R is designed at substantially the same value as that of parallel ON resistors of the transistors 411 to 415, such as 120Ω.

Corresponding bits of an impedance code DRZQP are supplied to gates of the transistors 411 to 415, respectively from the counter 110, thereby designating an impedance of the pull-up circuit 101.

The pull-up circuit 102 also has the same circuit configuration as that of the pull-up circuit 101 shown in FIG. 5 except that the other end of the resistor R is connected to a contact point A. Therefore, corresponding bits of the impedance code DRZQP are supplied to gates of five transistors, respectively included in the pull-up circuit 102.

Figure 6:
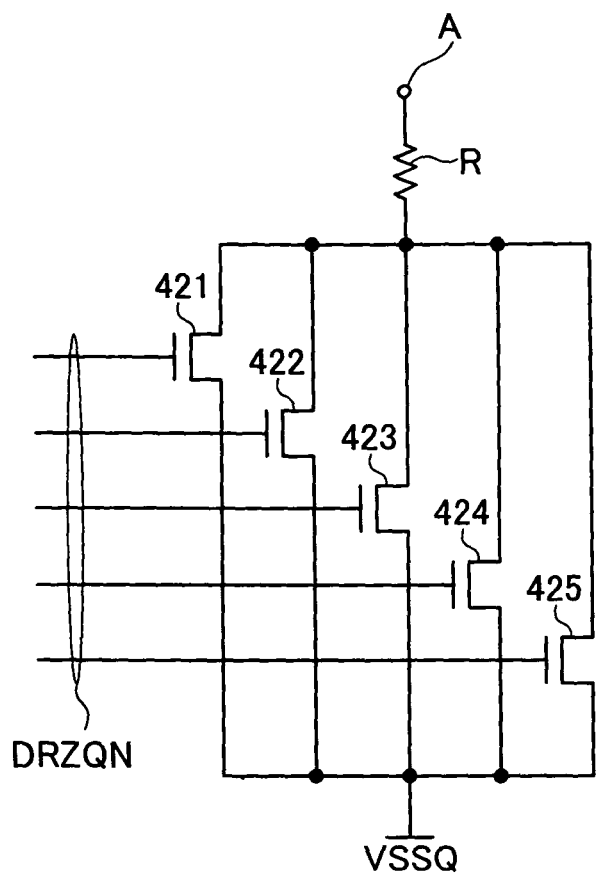
FIG. 6 is a circuit diagram of a pull-down circuit.

FIG. 6 is a circuit diagram of the pull-down circuit 103.

As shown in FIG. 6, the pull-down circuit 103 has substantially the same circuit configuration as that of the pull-down circuit PD included in the output buffer 71. That is, the pull-down circuit 103 includes five N-channel MOS transistors 421 to 425 connected in parallel between the power source terminal VSSQ, and the resistor R, one end of which is connected to drains of these transistors. The transistors 421 to 425 included in the pull-down circuit 103 correspond to the transistors 321 to 325 shown in FIG. 3, and have the same impedance. The pull-down circuit 103 is similar to the pull-up circuit 101 in this point. The resistor R also corresponds to the resistor R shown in FIG. 3. Therefore, a resistance value of this resistor R is designed at substantially the same value as that of parallel ON resistors of the transistors 421 to 425, such as 120Ω.

Corresponding bits of an impedance code DRZQN are supplied to gates of the transistors 421 to 425, respectively from the counter 120, thereby designating an impedance of the pull-down circuit 103.

In this manner, the pull-up circuits 101 and 102 have substantially the same circuit configurations as that of the pull-up circuit PU included in the output buffer 71, and the pull-down circuit 103 has substantially the same circuit configuration as that of the pull-down circuit PD included in the output buffer 71. Therefore, impedances of the pull-up circuits 101 and 102 and the pull-down circuit 103 are adjusted at 240Ω, for example.

As shown in FIG. 4, the pull-up circuit 102 and the pull-down circuit 103 constitute a replica buffer RepB having substantially the same circuit configuration as that of the output buffer 71. In this case, "substantially the same" means that even when transistors included in the replica buffer RepB are shrunk, these transistors are regarded the same. The contact point A as an output end of the replica buffer RepB is connected to a non-inverting input terminal (+) of the comparator 121 as shown in FIG. 4.

The counter 110 counts up or counts down when a control signal ACT1 is activated. The counter 110 counts up synchronously with the control signal ACT1 when a comparison signal COMP1 as an output of a comparator 111 is at a high level, and counts down synchronously with the control signal ACT1 when the comparison signal COMP1 is at a low level. A non-inverting input terminal (+) of the comparator 111 is connected to the calibration terminal ZQ, and an inverting input terminal (−) is connected to an intermediate point of resistors 141 and 142 connected between a power source potential (VDD) and a ground potential (GND). With this configuration, the comparator 111 compares a potential of the calibration terminal ZQ with an intermediate voltage (VDD/2). The comparator 111 sets the comparison signal COMP1 as an output of comparison at a high level when the potential of the calibration terminal ZQ is higher, and sets the comparison signal COMP1 at a low level when the intermediate voltage (VDD/2) is higher.

On the other hand, the counter 120 counts up or counts down when a control signal ACT2 is activated. The counter 120 counts up synchronously with the control signal ACT2 when a comparison signal COMP2 as an output of the comparator 121 is at a high level, and counts down synchronously with the control signal ACT2 when the comparison signal COMP2 is at a low level. A non-inverting input terminal (+) of the comparator 121 is connected to the connection point A as an output of a replica buffer, and an inverting input terminal (−) is connected to an intermediate point of the resistors 141 and 142. With this configuration, the comparator 121 compares an output potential of the replica buffer with the intermediate voltage (VDD/2). The comparator 121 sets the comparison signal COMP2 as an output of comparison at a high level when the output potential of the replica buffer is higher, and sets the comparison signal COMP2 at a low level when the intermediate voltage (VDD/2) is higher.

The counters 110 and 120 stop counting operations when the control signals ACT1 and ACT2 are inactivated, and hold current count values, respectively. As described above, a count value of the counter 110 is used for the impedance code DRZQP, and a count value of the counter 120 is used for the impedance code DRZQN. The codes DRZQP and DRZQN together form the impedance code DRZQ which as a collective term of these codes is supplied to an impedance adjusting circuit 72 shown in FIG. 1.

The control signals ACT1 and ACT2 are supplied from the control circuit 130. The control circuit 130 is started by activation of the internal calibration command IZQ or the internal long-calibration command IZQCL, and activates the control signals ACT1 and ACT2 synchronously with the internal clock signal ICLK. Specifically, the control circuit 130 counts the internal clock signal ICLK corresponding to ½ of a calibration period or continuously activates the control signal ACT1 until an end signal END1 is activated, after the internal calibration command IZQ or the internal long-calibration command IZQCL is activated. The control circuit 130 counts the internal clock signal ICLK corresponding to ½ of a calibration period or continuously activates the control signal ACT2 until an end signal END2 is activated, after the control signal ACT1 is inactivated. An activation cycle of the control signals ACT1 and ACT2 is set at 2n times (n is a natural number) a clock cycle of the internal clock signal ICLK.

The end signal END1 is generated by an end determining circuit 131, and is activated when the comparison signal COMP1 as an output of the comparator 111 changes in a predetermined pattern. Similarly, the end signal END2 is generated by an end determining circuit 132, and is activated when the comparison signal COMP2 as an output of the comparator 121 changes in a predetermined pattern. The "predetermined pattern" is a change pattern that appears when an impedance of the pull-up circuits 101 and 102 or the pull-down circuit 103 has reached a target value. A detailed pattern is that the logic level of the comparison signal COMP1 or COMP2 is inverted once or repeatedly, for example.

Accordingly, during one calibration period, an impedance adjustment of the pull-up circuit 101 is performed in a first half period and an impedance adjustment of the pull-down circuit 103 is performed in a latter half period. However, a calibration method is not limited thereto. In a calibration operation in response to the internal calibration command IZQ, there can be used a method that only either one of the pull-up circuit 101 and the pull-down circuit 103 is impedance-adjusted during one calibration period and that a circuit to be calibrated is switched each time when the internal calibration command IZQ is issued. This method is effective when a frequency of the internal clock signal ICLK is high and also when it is difficult to adjust both impedances of the pull-up circuit 101 and the pull-down circuit 103, during one calibration period in response to the internal calibration command IZQ.

A circuit configuration and an operation of the calibration circuit 100 are as described above. The impedance code DRZQ generated by the calibration circuit 100 in this way is supplied to the impedance adjusting circuit 72 shown in FIG. 1, thereby causing an impedance of the output buffer 71 to match an impedance of the replica buffer RepB. Therefore, by periodically performing a calibration operation, the impedance of the output buffer 71 can be set closer to a designed value regardless of a temperature change and a voltage variation.

Figure 7:
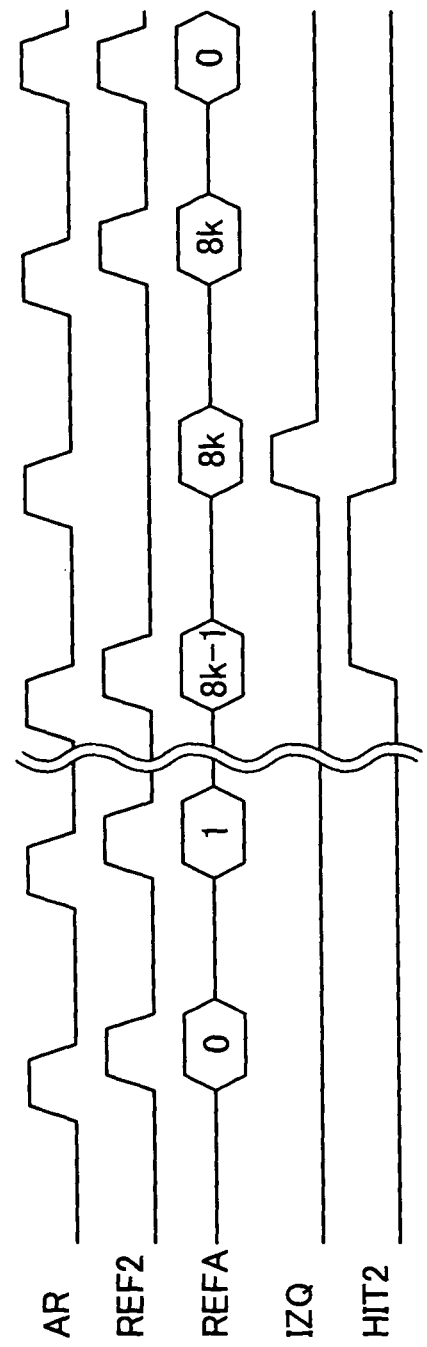
FIG. 7 is an operation waveform diagram for explaining an operation of the semiconductor device according to the first embodiment.

FIG. 7 is an operation waveform diagram for explaining an operation of the semiconductor device 10 according to the first embodiment. In an example shown in FIG. 7, a row address recorded in the address register 210 is set at a maximum value −1 (=8K−1) of the refresh address REFA.

As shown in FIG. 7, when the auto refresh command AR is issued from outside, the internal refresh command REF2 is usually activated in response to this issuance. Accordingly, a count value of the refresh counter 54 is incremented, and the row control circuit 51 performs a refresh operation. A count value of the refresh counter 54 is proceeded by the auto refresh command AR, and when the refresh address REFA as a count value matches the row address SETA (=8K−1) recorded in the address register 210, the SR latch circuit 240 is set in response to this match (HIT2 is activated). Consequently, the internal refresh command REF2 is not activated even when the auto refresh command AR is issued next. The internal calibration command IZQ is activated instead. That is, in this example, the auto refresh command AR at an 8K-th time is handled as the short calibration command ZQCS, and a calibration operation is performed instead of a refresh operation.

When the internal calibration command IZQ is activated, the SR latch circuit 240 is reset in response to the next auto refresh command AR. Accordingly, thereafter, when the auto refresh command AR is issued, the internal refresh command REF2 is activated as usual.

Figure 8:
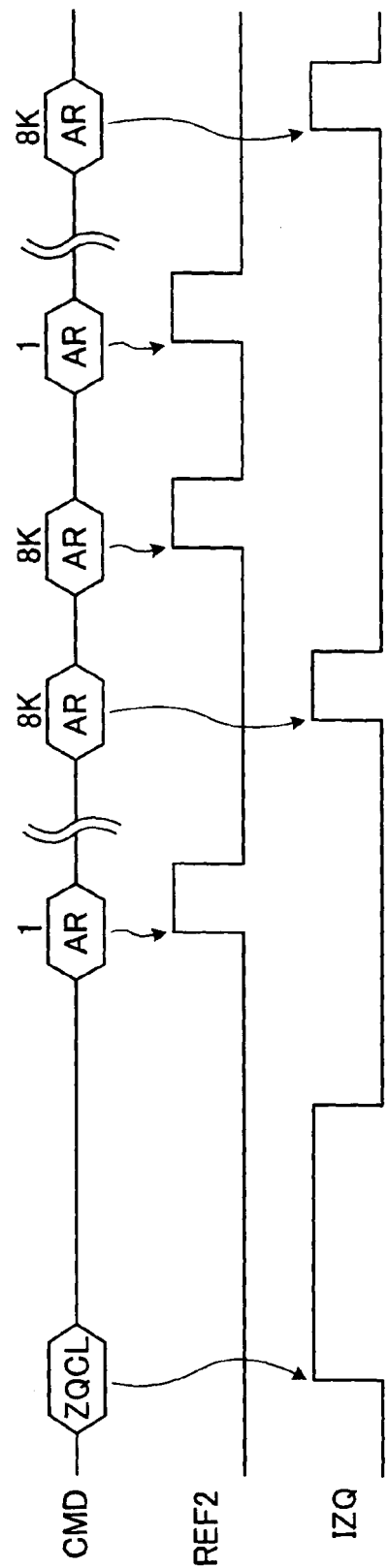
FIG. 8 is another operation waveform diagram for explaining an operation of the semiconductor device according to the first embodiment.

FIG. 8 is another operation waveform diagram for explaining an operation of the semiconductor device 10 according to the first embodiment. As shown in FIG. 8, in the first embodiment, the internal calibration command IZQ is activated and a short calibration operation is performed each time the refresh counter 54 makes one cycle by issuing the auto refresh command AR 8K times. A time taken by the refresh counter 54 to make one cycle is set shorter than an information holding time (tREF=64 ms) of the memory cells MC. Therefore, in this example, a calibration operation is performed in a frequency of once per about 64 ms.

The internal refresh command REF2 is not activated when the internal calibration command IZQ is generated, and therefore a count value of the refresh counter 54 is not incremented at this time. As a result, the number of the auto refresh command AR required for the refresh counter 54 to make one cycle increases by one (=8K+1 times). This means that there is a possibility that the time required for the refresh counter 54 to make one cycle exceeds the information holding time (tREF=64 ms) of the memory cells MC. However, a cycle of issuing the auto refresh command AR is very short of an average 7.8 µs, and an information holding time of the memory cells MC is a minimum guaranteed value. Considering the fact that the information holding time is longer in practice, no actual inconvenience occurs.

As shown in FIG. 8, when the long calibration command ZQCL is issued, a long calibration operation is performed as usual.

As explained above, in the first embodiment, a calibration operation is started in response to the auto refresh command AR each time the refresh counter 54 makes one cycle by issuing the auto refresh command AR 8K times. Therefore, it is not necessary to issue the short calibration command ZQCS from outside. Because the time required for the refresh counter 54 to make one cycle is prescribed by the information holding time (tREF=64 ms) of the memory cells MC, a periodic calibration operation is secured. Because an active command or a read command is not issued until a predetermined time passes after the auto refresh command AR is issued, a read operation or a write operation is not necessary during a calibration.

In the first embodiment, the internal calibration command IZQ is activated each time the refresh counter 54 makes one cycle, thereby starting a short calibration operation. However, an activation cycle of the internal calibration command IZQ is not limited to this cycle, so long the cycle is based on the number of times that the auto refresh command AR is issued. Therefore, the internal calibration command IZQ can be activated each time the refresh counter 54 makes a ½ cycle, or the internal calibration command IZQ can be activated each time the refresh counter 54 makes four cycles, for example.

Figure 9:
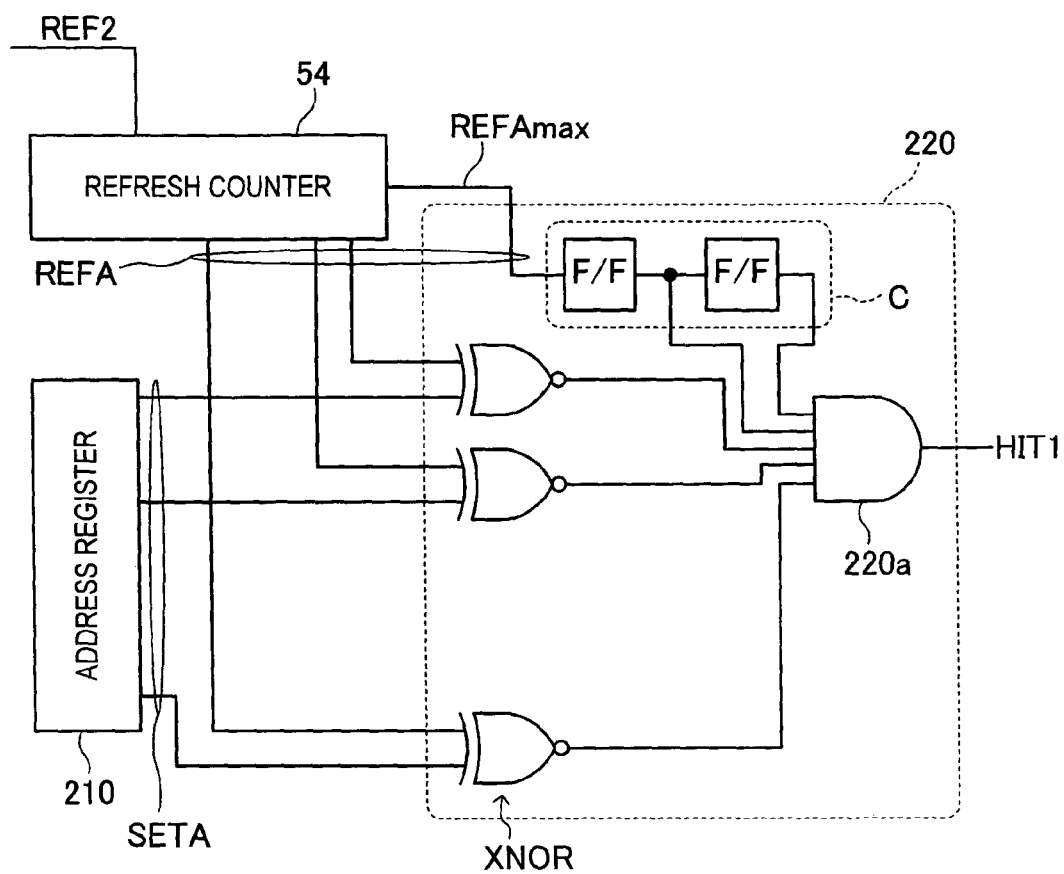
FIG. 9 is a circuit diagram of a comparator that activates an internal calibration command each time the refresh counter makes four cycles.

In the former case, the number of bits of the row address SETA stored in the address register 210 can be set smaller than that of the refresh address REFA by omitting a highest-order bit, for example. In the latter case, as shown in FIG. 9, a gate circuit XNOR that compares each bit of the refresh address REFA with each bit of the row address SETA is provided in the comparator 220, and a two-bit ripple counter C counting a highest-order bit REFAmax of the refresh address REFA is provided. Further, an AND gate 220a is used which activates the hit signal HIT1 when an output of the gate circuit XNOR and an output of the ripple counter C all become a high level.

Figure 10:
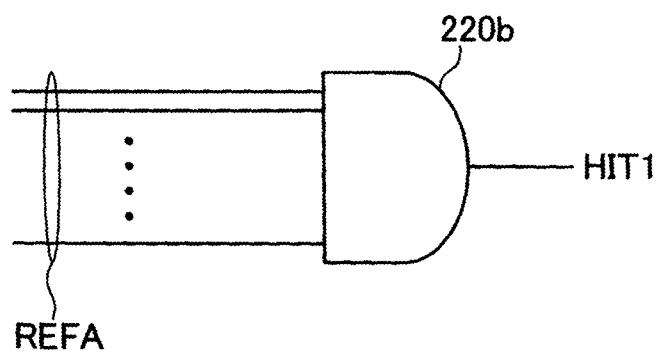
FIG. 10 is a diagram of the comparator constituted as the AND gate.

Furthermore, although the address register 210 that stores an arbitrary row address SETA is used in the first embodiment, it is not essential in the present invention. For example, the comparator 220 can be configured by an AND gate 220b that receives each bit of the refresh address REFA, as shown in FIG. 10.

A second embodiment of the present invention is explained next.

Figure 11:
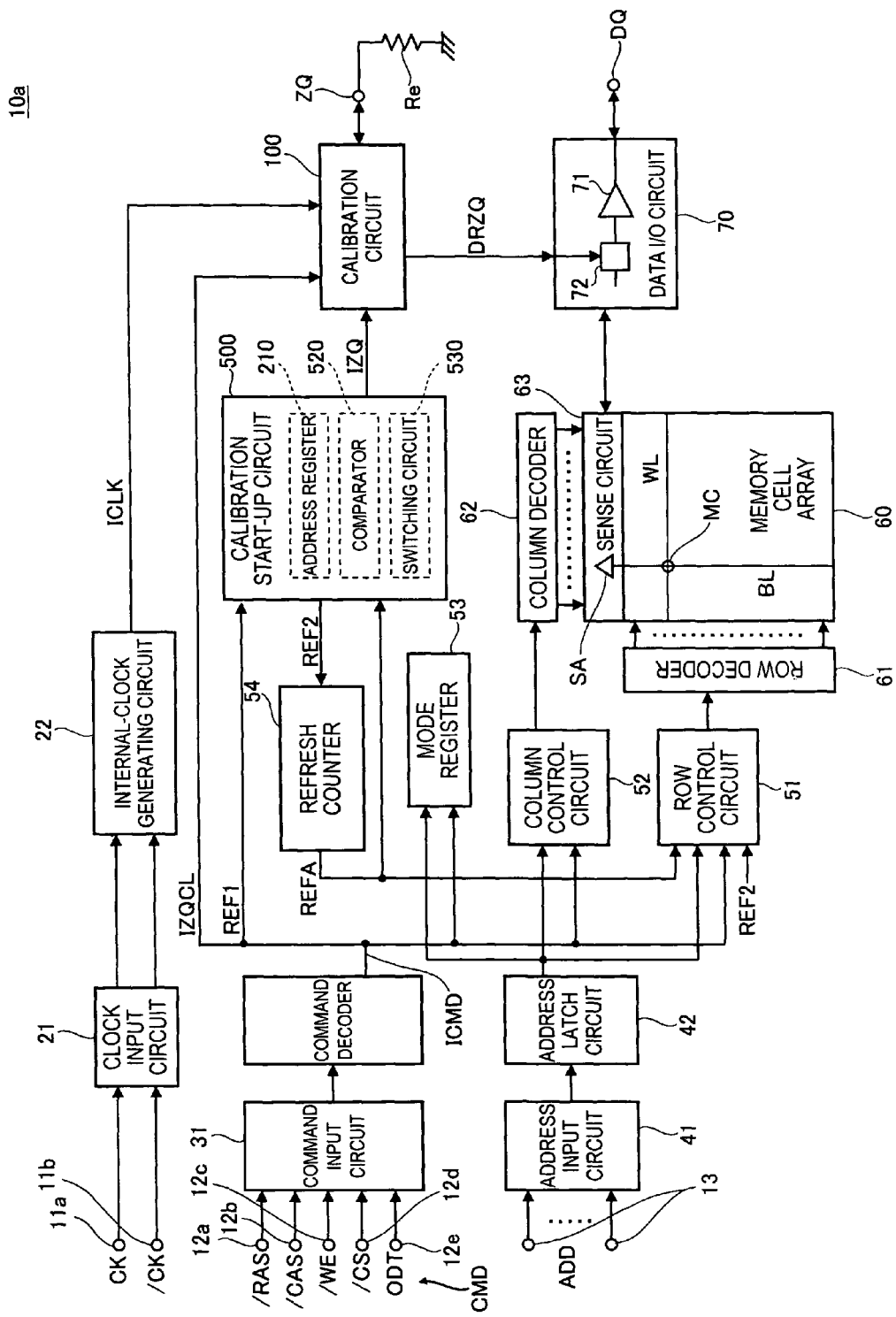
FIG. 11 is a block diagram showing an overall configuration of a semiconductor device according to the second embodiment.

FIG. 11 is a block diagram showing an overall configuration of a semiconductor device 10a according to the second embodiment.

The semiconductor device 10a according to the second embodiment is different from the semiconductor device 10 shown in FIG. 1 in that the calibration start-up circuit 200 is replaced by a calibration start-up circuit 500. Other configurations of the semiconductor device 10a according to the second embodiment are identical to those of the semiconductor device 10 shown in FIG. 1, and thus like elements are denoted by like reference numerals and explanations thereof will be omitted.

As shown in FIG. 11, the calibration start-up circuit 500 includes a comparator 520 and a switching circuit 530. The comparator 520 compares the row address SETA stored in the address register 210 with the refresh address REFA, and is different from the comparator 220 described above in that the comparator 520 can switch a cycle of outputting the hit signal HIT1. The switching circuit 530 switches the cycle of the comparator 520.

Figure 12:
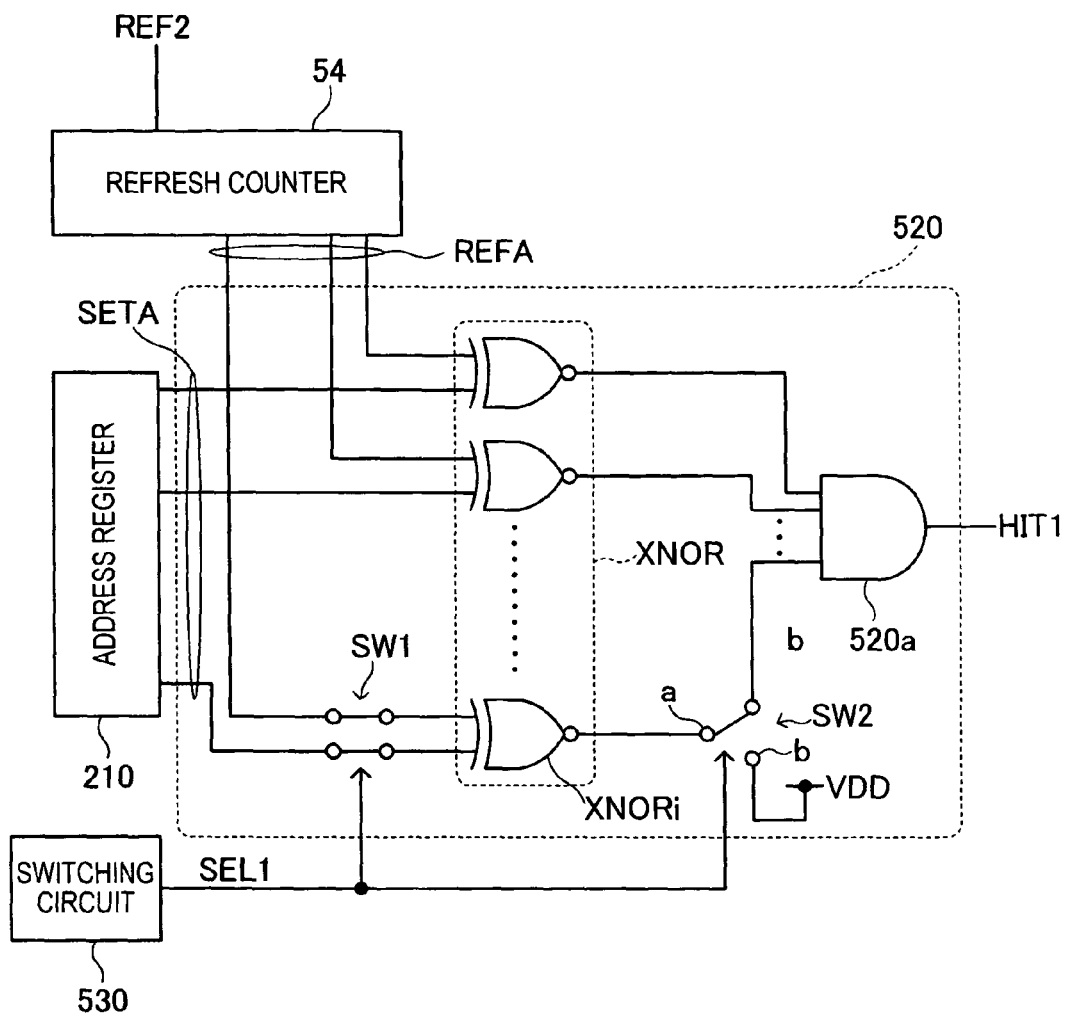
FIG. 12 is a circuit diagram of an example of a comparator.

FIG. 12 is a circuit diagram of an example of the comparator 520.

In an example shown in FIG. 12, the comparator 520 includes the gate circuit XNOR that compares each bit of the refresh address REFA with each bit of the row address SETA, an AND gate 520a that receives each output of the XNOR, and switches SW1 and SW2 that validate or invalidate a gate circuit XNORi corresponding to a predetermined bit. A control of the switches SW1 and SW2 is performed by a selection signal SEL1 supplied from the switching circuit 530.

To validate the gate circuit XNORi, the switch SW1 is set ON, and the switch SW2 is switched to a node a. The node a is an output of the gate circuit XNORi. Accordingly, the AND gate 520a activates the hit signal HIT1 when all bits of the refresh address REFA and the row address SETA match together. That is, an activation cycle of the hit signal HIT1 matches one cycle of the refresh counter 54.

On the other hand, to invalidate the gate circuit XNORi, the switch SW1 is set OFF, and the switch SW2 is switched to a node b. The node b is fixed at a high level. Accordingly, a bit corresponding to the gate circuit XNORi becomes a don't-care bit, and the AND gate 520a activates the hit signal HIT1 when other bits of the refresh address REFA and the row address SETA match together. That is, an activation cycle of the hit signal HIT1 matches a ½ cycle of the refresh counter 54.

As explained above, in this example, an activation cycle of the hit signal HIT1, that is, a generation cycle of the internal calibration command IZQ, can be set to either one cycle or a ½ cycle of the refresh counter 54.

Figure 13:
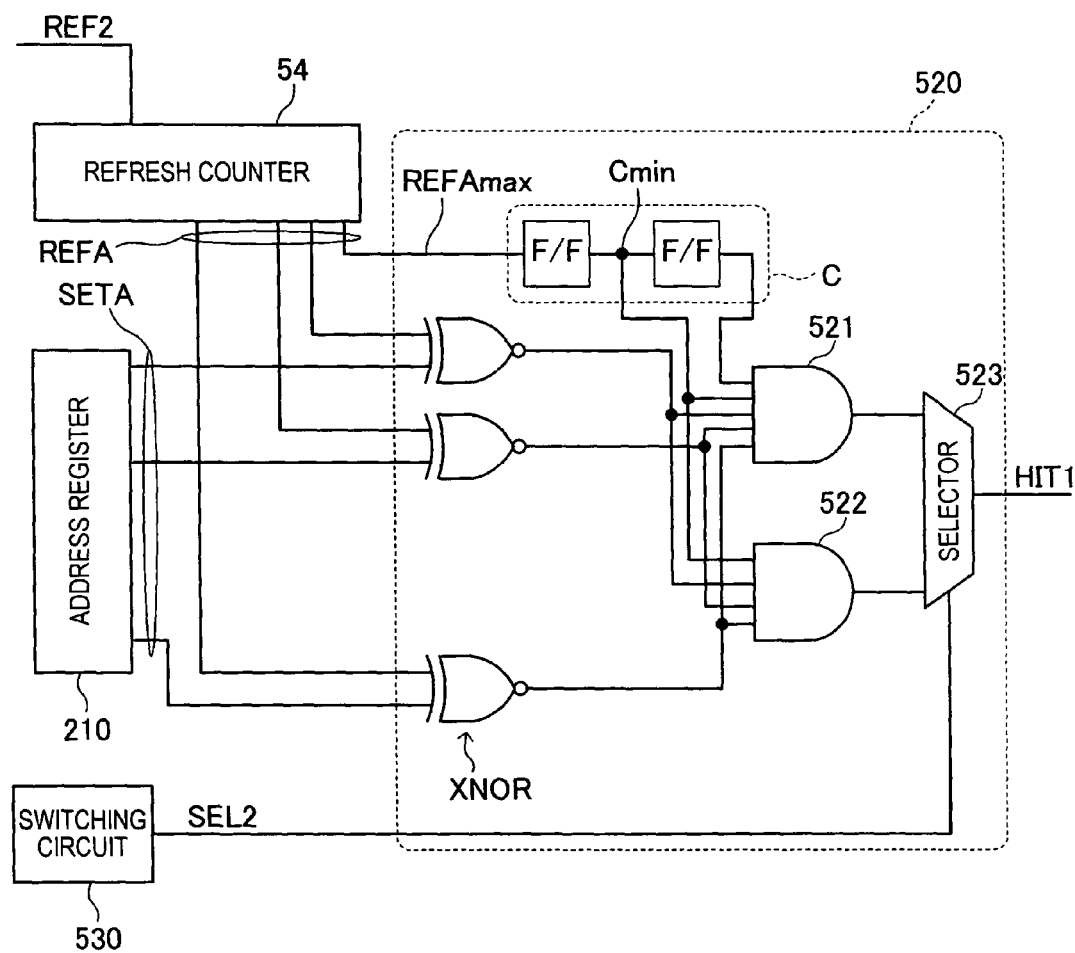
FIG. 13 is a circuit diagram showing another example of a comparator.

FIG. 13 is a circuit diagram showing another example of the comparator 520.

In the example shown in FIG. 13, the comparator 520 includes the gate circuit XNOR that compares each bit of the refresh address REFA with each bit of the row address SETA, the two-bit ripple counter C that counts a highest-order bit REFAmax of the refresh address REFA, an AND gate 522 that receives each output of the gate circuit XNOR and a lowest-order bit Cmin of the ripple counter C, an AND gate 521 that receives each output of the gate circuit XNOR and all output bits of the ripple counter C, and a selector 523 that selects one of outputs of the AND gates 521 and 522. A control of the selector 523 is performed by a selection signal SEL2 supplied by the switching circuit 530.

When an output of the AND gate 521 is selected, the selector 523 activates the hit signal HIT1 when all bits of the refresh address REFA and the row address SETA match together and also when all outputs of the ripple counter C become a high level. In this case, an activation cycle of the hit signal HIT1 matches four cycles of the refresh counter 54.

On the other hand, when an output of the AND gate 522 is selected, the selector 523 activates the hit signal HIT1 when all bits of the refresh address REFA and the row address SETA match together and also when a lowest-order bit of the ripple counter C becomes a high level. In this case, an activation cycle of the hit signal HIT1 matches two cycles of the refresh counter 54.

As explained above, in this example, an activation cycle of the hit signal HIT1, that is, a generation cycle of the internal calibration command IZQ, can be set to two cycles or four cycles of the refresh counter 54.

Figure 14A:
FIGS. 14A and 14B are block diagrams of examples of a configuration of the switching circuit.
Figure 14B:

The configuration of the switching circuit 530 is not particularly limited, and the switching circuit 530 can be configured such that the selection signals SEL1 and SEL2 are fixed at a manufacturing time or such that the selection signals SEL1 and SEL2 dynamically change based on an operation environment. As an example of the former case, the switching circuit 530 can be configured by an antifuse circuit as shown in FIG. 14A. As an example of the latter case, the switching circuit 530 can be configured by a temperature detecting circuit as shown in FIG. 14B. In the latter example, the selection signals SEL1 and SEL2 are output such that a generation cycle of the internal calibration command IZQ is shortened when the temperature detecting circuit detects a temperature change of a predetermined value or above. Because a property (a resistance, for example) of an element changes greatly according to the temperature, the frequency of performing a calibration operation needs to be increased when there is a large temperature change.

A third embodiment of the present invention is explained next.

Figure 15:
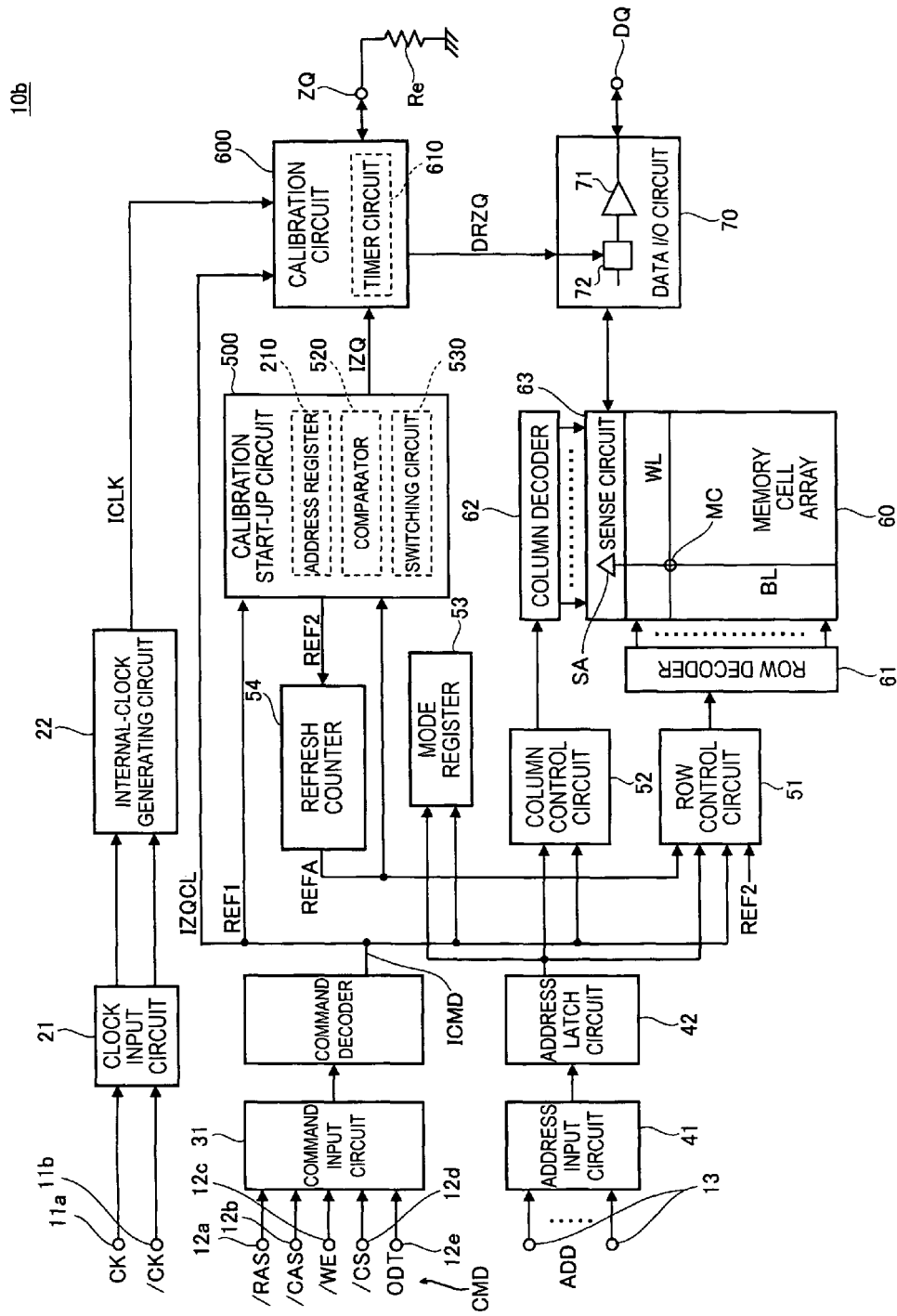
FIG. 15 is a block diagram showing an overall configuration of a semiconductor device according to the third embodiment.

FIG. 15 is a block diagram showing an overall configuration of a semiconductor device 10b according to the third embodiment.

The semiconductor device 10b according to the third embodiment is different from the semiconductor device 10a shown in FIG. 11 in that the calibration circuit 100 is replaced by a calibration circuit 600. Other configurations of the semiconductor device 10b according to the third embodiment are identical to those of the semiconductor device 10a shown in FIG. 11, and thus like elements are denoted by like reference numerals and explanations thereof will be omitted.

As shown in FIG. 15, the calibration circuit 600 includes a timer circuit 610. The timer circuit 610 forcibly terminates a short calibration operation started by the internal calibration command IZQ.

Figure 16:
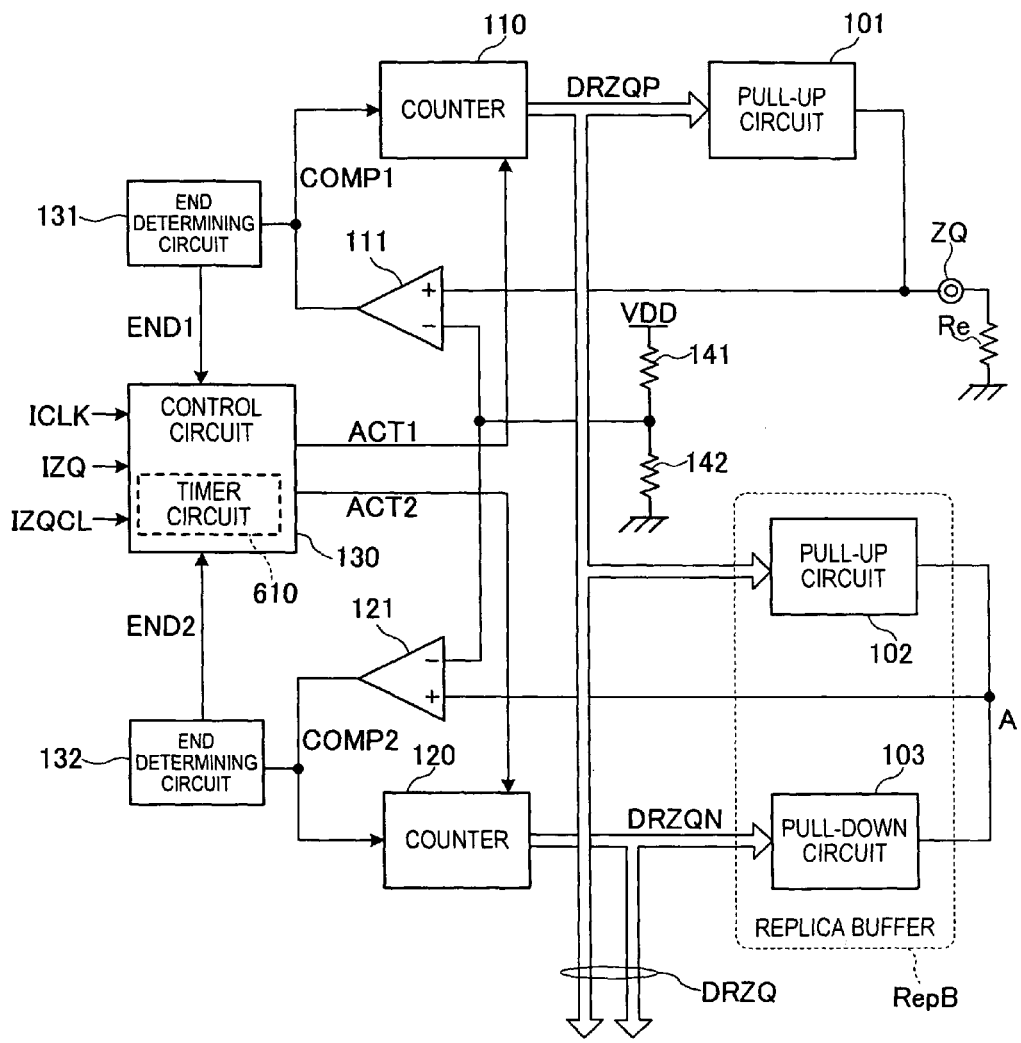
FIG. 16 is a circuit diagram of a calibration circuit.

FIG. 16 is a circuit diagram of the calibration circuit 600.

As shown in FIG. 16, the timer circuit 610 is included in the control circuit 130, and starts time counting in response to activation of the internal calibration command IZQ. The timer circuit 610 forcibly causes a calibration operation to be finished when a predetermined time has passed after the internal calibration command IZQ is activated. A counting time by the timer circuit 610 is set equal to or shorter than a time (for example, 110 nanoseconds (ns)) allocated to a refresh operation.

With this setting, the control circuit 130 forcibly finishes a calibration operation when the timer circuit 610 finishes time counting, even before a calibration period is over based on a count of the internal clock signal ICLK, after generation of the control signals ACT1 and ACT2 is started in response to the internal calibration command IZQ. Consequently, because the calibration operation can be finished within a time range allocated to a refresh operation, the control circuit 130 can receive the next command immediately after the time range allocated to the refresh operation has passed.

Figure 17:
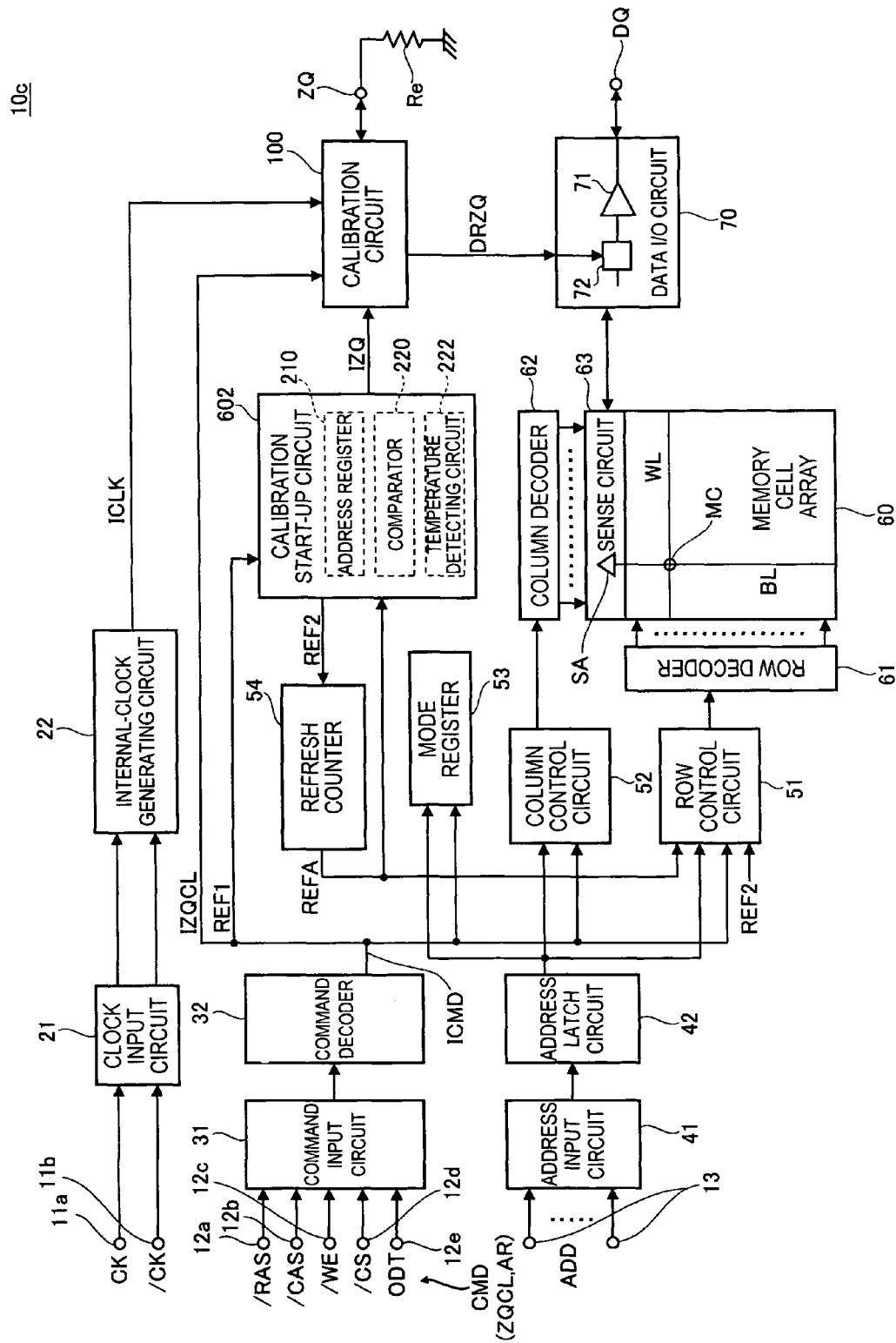
FIG. 17 is a block diagram showing an overall configuration of a semiconductor device according to a fourth embodiment of the present invention.

FIG. 17 is a block diagram showing an overall configuration of a semiconductor device 10c according to a fourth embodiment of the present invention.

The semiconductor device 10c according to the fourth embodiment is different from the semiconductor device 10 shown in FIG. 1 in that the calibration start-up circuit 200 is replaced by a calibration start-up circuit 602. Other configurations of the semiconductor device 10c according to the fourth embodiment are identical to those of the semiconductor device 10 shown in FIG. 1, and thus like elements are denoted by like reference numerals and explanations thereof will be omitted.

As shown in FIG. 17, the calibration start-up circuit 602 includes a temperature detecting circuit 222 in addition to the address register 210 and the comparator 220. The temperature detecting circuit 222 measures a temperature at the inside of the semiconductor device 10c, and shows temperature information of this measurement by signals T0 and T1. Details thereof will be described later.

Figure 18:
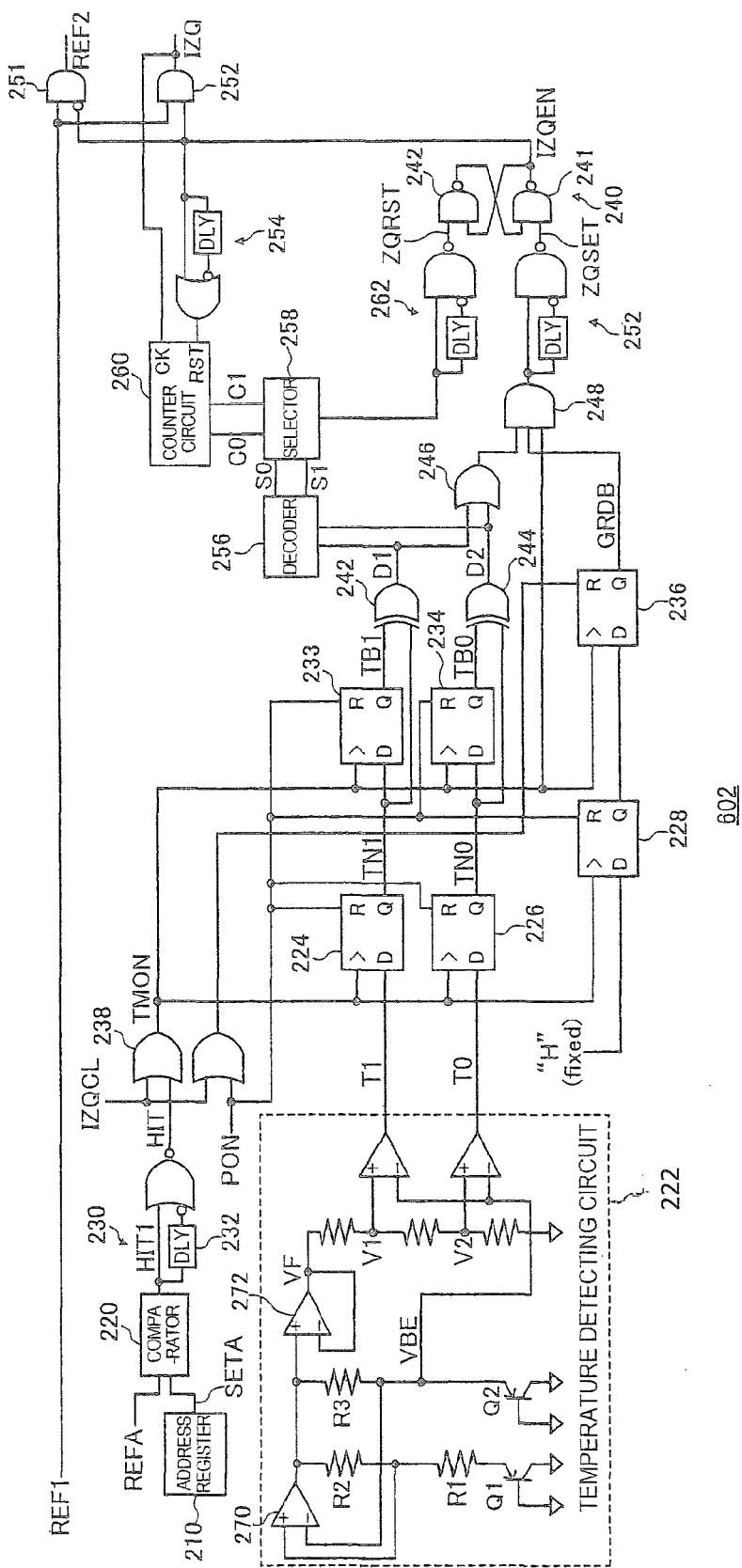
FIG. 18 is a circuit diagram of the calibration start-up circuit in the semiconductor device according to the fourth embodiment.

FIG. 18 is a circuit diagram of the calibration start-up circuit 602 according to the fourth embodiment.

The calibration start-up circuit 602 according to the fourth embodiment has a configuration having a temperature detection function added to the calibration start-up circuit 200 according to the first embodiment. A temperature detecting circuit 222 shows a temperature at the inside of the semiconductor device 10c by a two-bit signal including signals T0 and T1. The temperature detecting circuit 222 detects a temperature change by using temperature dependency of a voltage of a PN junction of transistors Q1 and Q2. Specifically, first, operational amplifiers 270 and 272 generate a potential VF having no temperature dependency from a base-emitter voltage of the transistors Q1 and Q2 of the same size, and resistively divide the potential VF to generate potentials V1 and V2 (V1>V2). On the other hand, an inter-base-emitter voltage VBE of the transistor Q2 becomes lower when a temperature becomes higher. Therefore, a temperature change can be detected by comparing the potentials V1 and V2 with the voltage VBE. When a temperature is low, the potentials have a relationship of VBE>V1>V2. Therefore, (T1, T0)=(L, L). When a temperature rises, the potentials will achieve a relationship of V1>VBE>V2, and (T1, T0)=(H, L). When a temperature further rises, the potentials become in a relationship of V1>V2>VBE, and (T1, T0)=(H, H). The temperature detecting circuit 222 can take various configurations, and the configuration shown in FIG. 18 is only an example.

An outline of the operation of the calibration start-up circuit 602 is as follows. First, the internal refresh command REF1 periodically becomes active high in response to a periodic input of the auto refresh command AR. The internal refresh command REF1 is input to the AND gate 251. Normally, the internal refresh command REF1 directly passes through the AND gate 251, and becomes the internal refresh command REF2. Therefore, a refresh operation is performed each time the internal refresh command REF1 becomes active high.

When the refresh address REFA matches the row address SETA, the internal calibration command IZQ is issued under a condition that there is a temperature change. That is, in the fourth embodiment, even when the refresh address REFA matches the row address SETA, a calibration is not performed when there is no temperature change since the addresses have matched last time. A refresh operation is performed when there is no temperature change. Although details are described later, when a temperature change is not detected, the SR latch 240 is not set, a signal IZQEN becomes a low level, and issuance of the internal calibration command IZQ is blocked. According to this control method, a calibration is omitted when a temperature change does not occur, that is, when a calibration is not really necessary. Therefore, power consumption of the semiconductor device 10c can be reduced.

When there is a temperature change, the internal calibration command IZQ is issued. The number of times that the internal calibration command IZQ is issued depends on the scale of a temperature change. In the fourth embodiment, when the scale of a temperature change is equal to or smaller than a predetermined value, the internal calibration command IZQ is issued twice. When the scale of a temperature change is larger than the predetermined value, the internal calibration command IZQ is issued four times. According to this control method, the number of calibration times can be flexibly adjusted according to the necessity of a calibration.

A configuration and an operation of the calibration start-up circuit 602 are explained below in detail. First, the internal long-calibration command IZQCL and the hit signal HIT as an output of the one-shot pulse generating circuit 230 are input to an OR gate 238 of two inputs. The hit signal HIT is a one-shot pulse that becomes active high when the refresh address REFA matches the row address SETA.

When a signal TMON as an output of the OR gate 238 changes from a low level to a high level, latch circuits 224, 226, 228, 233, 234, and 236 latch a level of an input node D, respectively. The signals T1 and T0 as temperature information are input to the input nodes D of the latch circuits 224 and 226. When the signal TMON becomes active high, the signals T1 and T0 are latched by the latch circuits 224 and 226. When the signal TMON becomes active high again, these latched signals (TN1, TN0) are shifted to the latch circuits 233 and 234. The signal TMON is activated by the internal long-calibration command IZQCL or the hit signal HIT. The latch circuit 228 latches a high-level signal (a fixed signal) by activation of the internal long-calibration command IZQCL or the hit signal HIT. The high-level signal is shifted to the latch circuit 236 by the next activation of the signal TMON.

The XOR gate 242 compares a signal TB1 output from an output node Q of the latch circuit 233 with a signal TN1 output from the output node Q of the latch circuit 224, and outputs a signal D1. The XOR gate 244 compares a signal TB0 output from the output node Q of the latch circuit 234 with a signal TN0 output from the output node Q of the latch circuit 226, and outputs a signal D2. That is, the signal D1 becomes a high level when there is a change between the signal TB1 from previous temperature information and the signal TN1 as subsequent temperature information. Similarly, the signal D2 becomes a high level when there is a change between the signals TB0 and TN0. Accordingly, the temperature change is specified by the signals D1 and D2.

The signals D1 and D2 are input to an OR gate 246. An output of the OR gate 246 becomes L when D1=D2=0, that is, when there is no temperature change, and becomes H when there is a temperature change. The output of the OR gate 246 is input to an AND gate 248 of three inputs. Remaining two inputs of the AND gate are the signal TMON and a signal GRDB as an output of the latch circuit 236. When the hit signal HIT becomes active high, all the three inputs of the AND gate are now a high level, and the one-shot pulse circuit 252 generates a low-level one-shot pulse, and the SR latch circuit 240 is set. As a result, the signal IZQEN as an output of the SR latch circuit 240 becomes active high. The latch circuit 236 is reset when the internal long-calibration command IZQCL becomes active high. Therefore the SR latch circuit 240 is not set.

When the signal IZQEN becomes active high, the internal calibration command IZQ is issued instead of the internal refresh command REF2, and a calibration is performed. When there is no temperature change, an output of the AND gate 248 becomes a low level. Therefore, the signal IZQEN becomes a low level, and the internal refresh command REF2 is issued. When the internal long-calibration command IZQCL is active high, the signal IZQEN becomes a low level and the internal calibration command IZQ is not issued because the signal GRDB as an output of the latch circuit 236 becomes a low level although the signals T1 and T0 are latched. However, the calibration circuit 100 is directly activated by the internal long-calibration command IZQCL (see FIG. 17). By latching the signals T0 and T1 when the command IZQCL is active, temperature information is updated when the command IZQCL is active high. Accordingly, unnecessary calibrations can be prevented when there is no temperature change after the command IZQCL.

Meanwhile, the signals D1 and D2 are also input to a decoder 256. The decoder 256 activates S1 when both the signals D1 and D2 are at a high level, and activates S0 when one of the signals D1 and D2 is at a high level. S1 and S0 are input to a selector 258.

When the signal IZQEN is activated at a high level, a counter circuit 260 is reset via a one-shot pulse generating circuit 254. Thereafter, the counter circuit 260 updates a count value each time the internal calibration command IZQ is activated. The count value is supplied to the selector circuit 258 as a two-bit signal (00 to 11) including C0 and C1. In case S1 is at a high level, the selector circuit 258 activates a one-shot pulse circuit 262 when a count value reaches "00" after counting up from 00. At this time, the SR latch circuit 240 is reset, and the signal IZQEN becomes a low level. Thereafter, the internal refresh command REF2 is issued instead of the internal calibration command IZQ. In case S0 is at a high level, the selector circuit 258 activates the one-shot pulse circuit 262 when a count value reaches "10" after counting up from 00. As a result, In case S1 is at a high level, the internal calibration command IZQ is issued four times. In case S0 is at a high level, the internal calibration command IZQ is issued twice.

When a power ON signal PON is activated at a power activation time, the latch circuits 224, 226, 228, 233, and 234 are reset.

Figure 19:
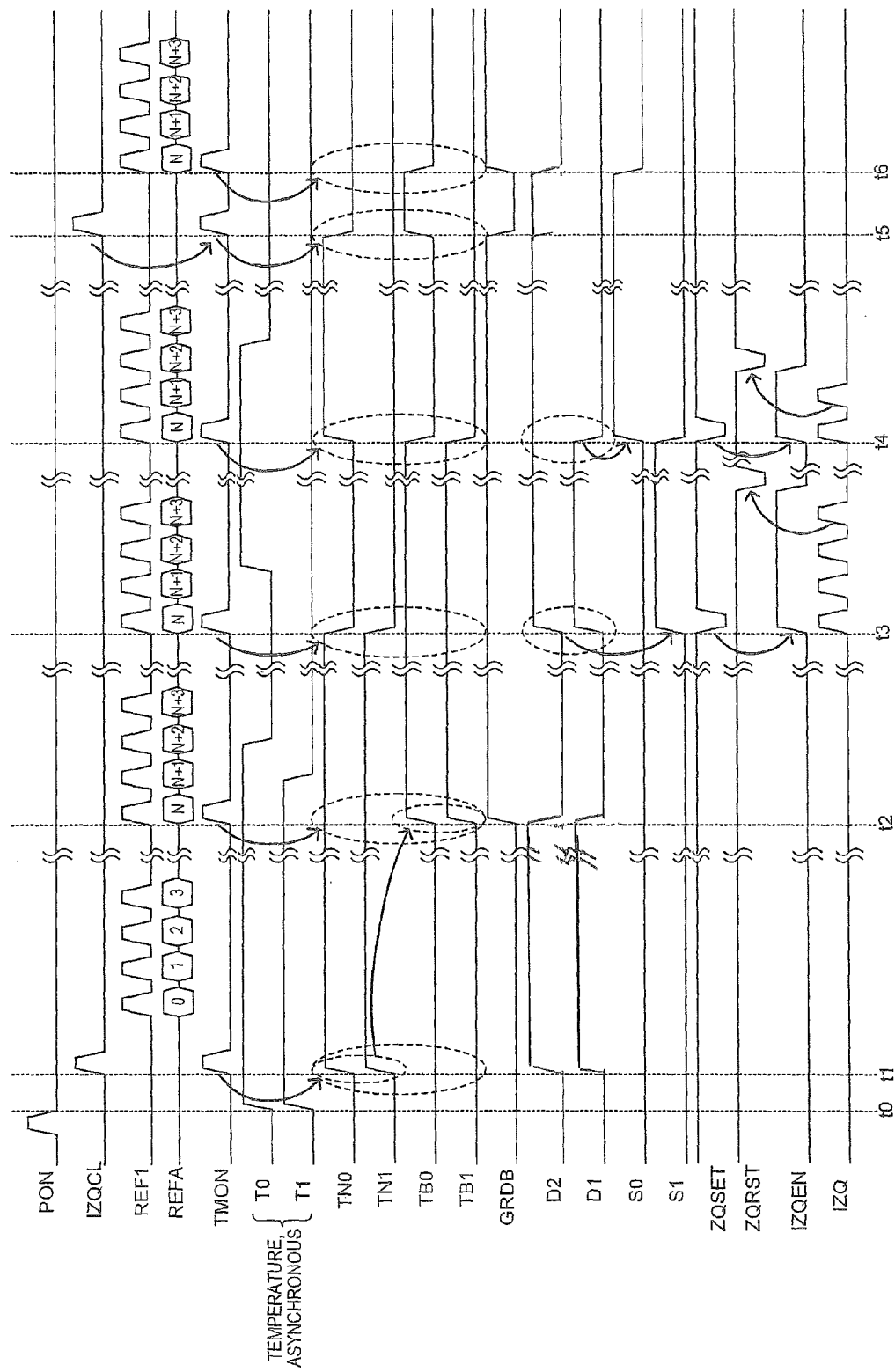
FIG. 19 is an operation waveform diagram for explaining an operation of the semiconductor device according to the fourth embodiment.

FIG. 19 is an operation waveform diagram for explaining an operation of the semiconductor device 10c according to the fourth embodiment.

In FIG. 19, the power ON signal PON is activated by one shot at a time t0, and the internal long-calibration command IZQCL is activated by one shot at a time t1. In response to this, the latch circuits 224 and 226 latch the signals T0 and T1, which are output from the latch circuits 224 and 226 as the signals TN1 and TN0. The latch circuit 228 latches a fixed high-level signal, and outputs the signal from a Q terminal to the latch circuit 236.

The internal refresh command REF1 periodically becomes active high by the auto refresh command AR. The refresh address REFA is sequentially designated while being linked to this periodical highly active state. At a time t2, when the refresh address REFA matches the row address SETA designated in advance, the signal TMON becomes active high. When the signal TMON becomes active high, the latch circuits 224, 226, 228, 233, 234, and 236 latch data, respectively. The signals TN1 and TN0 latched and output by the latch circuits 224 and 226 at the time t1 are shifted to the latch circuits 233 and 234. The latch circuits 224 and 226 latch the signals T1 and T0 showing a temperature at the time t2.

The latch circuit 236 latches a fixed high-level signal, and outputs the signal GRDB at a high level from an output node Q. Because there is no temperature change during a period from the time t1 to the time t2, the signals D1 and D2 remain at a low level. Therefore, an output of the AND gate 248 remains at a low level, and the SR latch 240 is not set. Because the signal IZQEN becomes inactive, the internal calibration command IZQ is not issued, and the internal refresh command REF2 is issued. That is, a calibration is not performed although the refresh address REFA matches the row address SETA.

At a time t3, the refresh address REFA matches the row address SETA again. During a period from the time t2 to the time t3, the signal T1 changes from H to L, and the signal T0 changes from H to L. Because both the signals T0 and T1 change, it is determined that there is a large temperature change. The signal TMON becomes active high based on a match of addresses, and new temperature information (T1: L, T0: L) is latched by the latch circuits 224 and 226 as TN1, TN0. The latch circuits 233 and 234 latch temperature information (T1: H, T1: H) at the time t2 as TB1, TB0. Because both the signals T1 and T0 change, the signals D1 and D2 become a high level.

Because there is a temperature change, an output of the AND gate 248 also becomes a high level, the signal IZQEN is activated, and the internal calibration command IZQ is issued. The one-shot pulse generating circuit 254 resets the counter circuit 260. On the other hand, because both the signals D1 and D2 are at a high level, the decoder 256 sets S1 active high. Because S1 is activated, the selector 258 does not reset the SR latch circuit 240 until a count value output by the counter circuit 260 reaches "00". Therefore, the internal calibration command IZQ is thereafter kept issued while being linked to the refresh command REF1. The counter circuit 260 counts up each time the command IZQ is issued. When a count value becomes "00", the SR latch circuit 240 is reset, and thereafter the refresh command REF2 is kept issued synchronized with the refresh command REF1. That is, the internal calibration command IZQ is issued four times, and thereafter the refresh command REF2 is kept issued.

At a time t4, the refresh address REFA matches the row address SETA again. During a period from the time t3 to the time t4, the signal T0 changes from L to H, but the signal T1 does not change. Although there is a temperature change, this change is small. The latch circuits 224 and 226 latch new temperature information (T0: H, T1: L) as TN0, TN1, while the latch circuits 233 and 234 latch temperature information (T0: L, T1: L) of the time t3. Because only the signal T0 changes, only the signal D2 becomes a high level.

Because there is a temperature change, the signal IZQEN is activated, the internal calibration command IZQ is issued, and the counter circuit 260 is reset. Because only the signal D2 is at a high level, the decoder 256 sets S0 active high. Because S0 is activated, the selector 258 does not reset the SR latch circuit 240 until when a count value output by the counter circuit 260 reaches "10". Accordingly, thereafter, the internal calibration command IZQ is kept issued synchronized with the refresh command REF1. When a count value becomes "10", the SR latch circuit 240 is reset, and thereafter the refresh command REF2 is kept issued synchronized with the refresh command REF1. As a result, the internal calibration command IZQ is issued twice.

In the fourth embodiment, a calibration is skipped when there is no temperature change, that is, when a calibration is not really necessary. Power consumption can be reduced by omitting unnecessary calibrations. By changing the number of calibration times according to the scale of a temperature change, a control is performed such that a calibration is performed for a necessary number of times when the calibration is particularly necessary. In this manner, an effective calibration can be performed.

Figure 20:
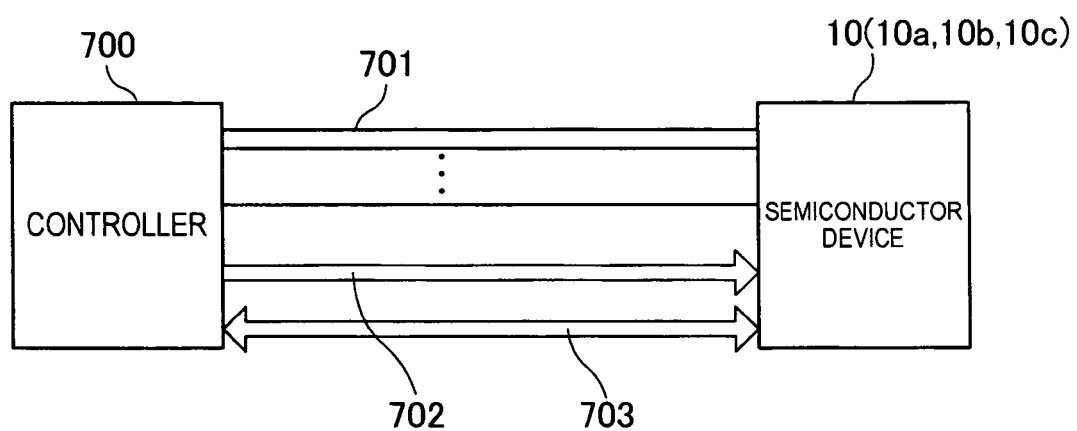
FIG. 20 is a block diagram of a data processing system including a semiconductor device.

FIG. 20 is a block diagram of a data processing system including the semiconductor device 10 (10a, 10b, 10c).

The data processing system shown in FIG. 20 is configured by the semiconductor device 10 (10a, 10b, 10c) and a controller 700, and both are connected to each other by a command bus 701, an address bus 702, and a data bus 703. When issuing the auto refresh command AR to the semiconductor device 10 (10a, 10b, 10c), the controller 700 inputs the auto refresh command AR to the semiconductor device 10 (10a, 10b, 10c) via the command bus 701. Consequently, the semiconductor device 10 (10a, 10b, 10c) performs a refresh operation or a short calibration operation. In this manner, because the semiconductor device 10 (10a, 10b, 10c) performs a short calibration operation in response to an input of the auto refresh command AR of a predetermined number of times, the controller 700 does not need to perform a short calibration command (ZQCS). That is, the controller 700 does not need to have a timer circuit to periodically issue the short calibration command (ZQCS).

Figure 21:
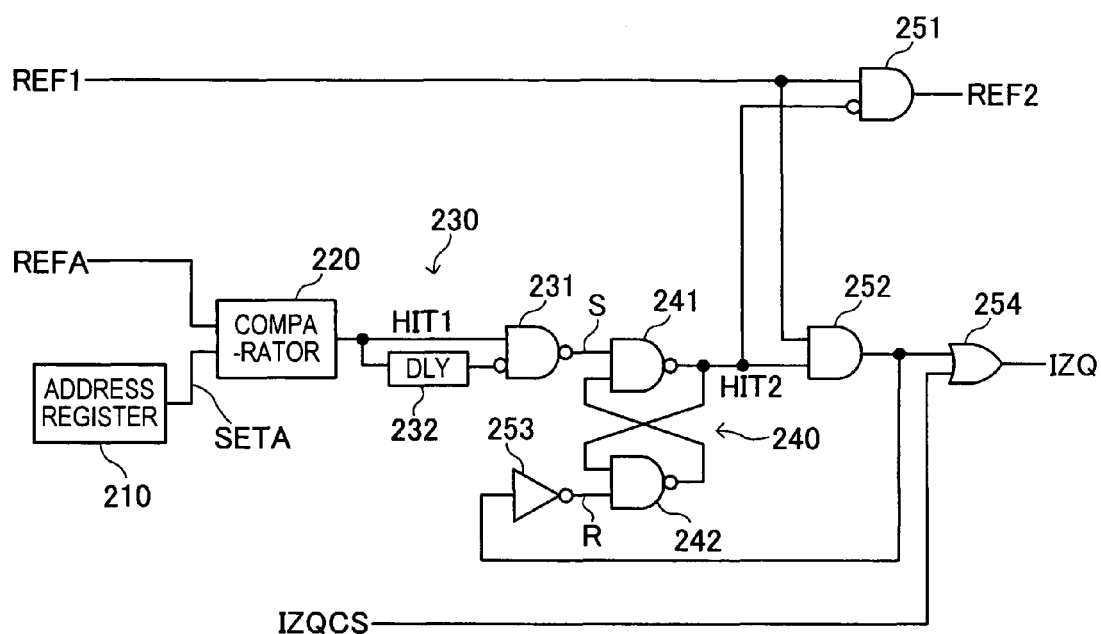
FIG. 21 is a circuit diagram of the modification of the calibration start-up circuit according to a further embodiment of the present invention.

However, the controller 700 can also issue the short calibration command (ZQCS), and the semiconductor device 10 (10a, 10b, 10c) can perform a short calibration operation in response to the short calibration command (ZQCS). In this case, it suffices to provide an OR gate 254 that receives an output of the AND gate 252 and an internal short-calibration command IZQCS, like a calibration start-up circuit 200a shown in FIG. 21.

It is apparent that the present invention is not limited to the above embodiments, but may be modified and changed without departing from the scope and spirit of the invention.

The invention claimed is:

1. A semiconductor device comprising:
a first control circuit configured to produce a hit signal each time an internal refresh command is issued a predetermined number of times;
a second control circuit configured to produce a control signal in response to the hit signal being produced, the control signal changing between first and second levels in response to temperature information indicative of a temperature of the semiconductor device;
a memory cell array including a plurality of memory cells;
an output buffer coupled to the memory cell array and configured to output data read from the memory cells;
a calibration circuit coupled to the output buffer and configured to perform, when activated, a calibration operation on the output buffer to adjust an impedance of the output buffer;
a refresh circuit coupled to the memory cell array and configured to perform a refresh operation on the memory cells of the memory cell array in response to the internal refresh command; and
a third control circuit configured to issue the internal refresh command when the control signal takes the first level and to activate the calibration circuit in response to the hit signal when the control signal takes the second level.

2. The semiconductor device as claimed in claim 1, wherein the third control circuit is configured to issue the internal refresh command without triggering a production of the hit signal.

3. The semiconductor device as claimed in claim 1, wherein the second control circuit activates the calibration circuit each time an auto refresh command has issued for a predetermined number of times.

4. The semiconductor device as claimed in claim 1, wherein the third control circuit is configured to deactivate the calibration circuit to refrain from performing the calibration operation when the control signal takes the first level.

5. The semiconductor device as claimed in claim 4, wherein the third control circuit is configured to not issue the internal refresh command to refrain from performing the refresh operation when the control signal takes the second level.

6. The semiconductor device as claimed in claim 1, wherein the refresh circuit includes a counter configured to count a number of issuance of the refresh command, and wherein the first control circuit includes:
an address register configured to store an address; and
a comparator configured to compare the address stored in the address register with an address corresponding to the number of issuance of the refresh command and to output the hit signal when the address stored in the address register and the address corresponding to the number of issuance of the refresh command are coincident with each other.

7. The semiconductor device as claimed in claim 6, wherein the comparator of the first control circuit is configured to refrain from outputting the hit signal when the address stored in the address register and the address corresponding to the number of issuance of the refresh command are different from each other.

8. The semiconductor device as claimed in claim 1, wherein a number of calibration operations performed by the calibration circuit is changed according to a scale of a temperature change detected for the semiconductor device.

9. The semiconductor device as claimed in 8, wherein a larger number of calibration operations is performed as the detected temperature change becomes larger.

10. The semiconductor device as claimed in claim 1, wherein the second control circuit is configured to check a content of the temperature information each time the hit signal is produced.

11. The semiconductor device as claimed in claim 10, wherein the second control circuit is configured to change the control signal from one of the first and second levels to the other of the first and second levels, when the temperature information upon a preceding production of the hit signal is different in content from the temperature information upon a current production of the hit signal.

12. The semiconductor device as claimed in claim 11, wherein the second control circuit includes:
- a temperature detection circuit configured to generate the temperature information of the semiconductor device;
- a first register coupled to the temperature detection circuit to receive the temperature information upon the current production of the hit signal; and
- a second register coupled to the first register to receive the temperature information upon the preceding production of the hit signal.

13. The semiconductor device as claimed in claim 12, wherein the second control circuit further includes a comparator coupled to the first and second registers to compare a content of the temperature information upon the current production of the hit signal with a content of the temperature information upon the preceding production of the hit signal.

14. The semiconductor device as claimed in claim 11, wherein the temperature information comprises first and second temperature bits, the first temperature bit taking one of the first and second levels when the temperature of the semiconductor device is equal to or higher than a first degree and the other of the first and second levels when the temperature of the semiconductor device is lower than the first degree, the second temperature bit taking one of the first and second levels when the temperature of the semiconductor device is equal to or higher than a second degree and the other of the first and second levels when the temperature of the semiconductor device is lower than the second degree, the first degree and the second degree being different from each other.

15. The semiconductor device as claimed in claim 14, wherein the control signal takes the second level during a first period of time when the first temperature bit of the temperature information upon the preceding production of the hit signal and the first temperature bit of the temperature information upon the current production of the hit signal are different from each other, the control signal taking the second level during a second period of time when the first temperature bit of the temperature information upon the preceding production of the hit signal and the first temperature bit of the temperature information upon the current production of the hit signal are equal to each other and the second temperature bit of the temperature information upon the preceding production of the hit signal and the second temperature bit of the temperature information upon the current production of the hit signal are different from each other, the first period of time and the second period of time being different from each other.

16. The semiconductor device as claimed in claim 15, wherein the first degree is higher than the second degree and the first period of time is longer than the second period of time.

17. A semiconductor device, comprising:
a memory cell array including a plurality of memory cells;
an output buffer coupled to the memory cell array and configured to output data read from the memory cells;
a calibration circuit coupled to the output buffer and configured to perform, when activated, a calibration operation on the output buffer to adjust an impedance of the output buffer;
a refresh circuit coupled to the memory cell array and configured to perform, when activated, a refresh operation on the memory cells of the memory cell array; and
a start-up circuit that activates the calibration circuit when an auto refresh command has been issued a predetermined number of times, if a temperature detecting circuit detects a temperature change,
wherein the start-up circuit stores temperature information detected by the temperature detecting circuit when the auto refresh command has been issued for the predetermined number of times, and
wherein the start-up circuit detects the temperature change by comparing temperature information detected when the auto refresh command has been issued for the predetermined number of times with the temperature information stored therein.

18. A semiconductor device, comprising:
a memory cell array including a plurality of memory cells;
an output buffer coupled to the memory cell array and configured to output data read from the memory cells;
a calibration circuit coupled to the output buffer and configured to perform, when activated, a calibration operation on the output buffer to adjust an impedance of the output buffer;
a refresh circuit coupled to the memory cell array and configured to perform, when activated, a refresh operation on the memory cells of the memory cell array; and
a start-up circuit that activates the calibration circuit when an auto refresh command has been issued a predetermined number of times, if a temperature detecting circuit detects a temperature change,
wherein the start-up circuit stores temperature information detected by the temperature detecting circuit when a long calibration command is issued, and
wherein the start-up circuit detects the temperature change by comparing temperature information detected when the auto refresh command has been issued for the predetermined number of times with the temperature information stored therein.

\* \* \* \* \*